United States Patent [19]
Miller

[11] Patent Number: 5,931,372
[45] Date of Patent: Aug. 3, 1999

[54] ULTRASONIC BONDING METHOD AND APPARATUS WITH LOCKING TOOL TIP

[76] Inventor: Charles F. Miller, 651 Pathfinder Trail, Anaheim Hills, Calif. 92807

[21] Appl. No.: 08/801,042

[22] Filed: Feb. 14, 1997

[51] Int. Cl.$^6$ ............................. B23K 20/10; H01L 21/60
[52] U.S. Cl. ........................ 228/180.5; 228/1.1; 228/4.5; 228/45
[58] Field of Search ............................. 228/4.5, 45, 180.5, 228/1.1

[56] References Cited

U.S. PATENT DOCUMENTS

| | | | |
|---|---|---|---|
| 3,102,331 | 9/1963 | Costa | 228/4.5 |
| 3,626,590 | 12/1971 | Miller | 228/4.5 |
| 4,550,871 | 11/1985 | Chan et al. | 228/4.5 |
| 5,386,935 | 2/1995 | De Leon et al. | 228/1.1 |

FOREIGN PATENT DOCUMENTS

83/04201  12/1983  WIPO ..................... 228/4.5

Primary Examiner—Patrick Ryan
Assistant Examiner—Jeffrey T. Knapp
Attorney, Agent, or Firm—William L. Chapin

[57] ABSTRACT

An ultrasonic bonding method and apparatus utilizes a locking mechanism which limits motion of an ultrasonic bonding tool tip during formation of a bond. In a basic embodiment of tie invention, motion of the tool tip in the up/down, z-axis direction is inhibited during bond formation. Preferably motion in the longitudinal, in/out y-axis direction is also inhibited, and motion in the lateral, x-direction may optionally be limited. A separate locking mechanism or brake is provided for each orthogonal direction in which it is desired to inhibit motion during bond formation. Each brake is actuated in response to a bond initiation command signal, locking the tool tip against motion in particular coordinate directions prior to application of ultrasonic energy to a bond site, and maintaining the tip in that position for a period sufficient to melt wire insulation, weld the stripped wire to a bond site such as the microcircuit pad or lead, and allow the weld to cool and solidify. At the end of the bond formation command signal, the brake command signal is removed, allowing the tool to be moved to another bond site.

19 Claims, 27 Drawing Sheets

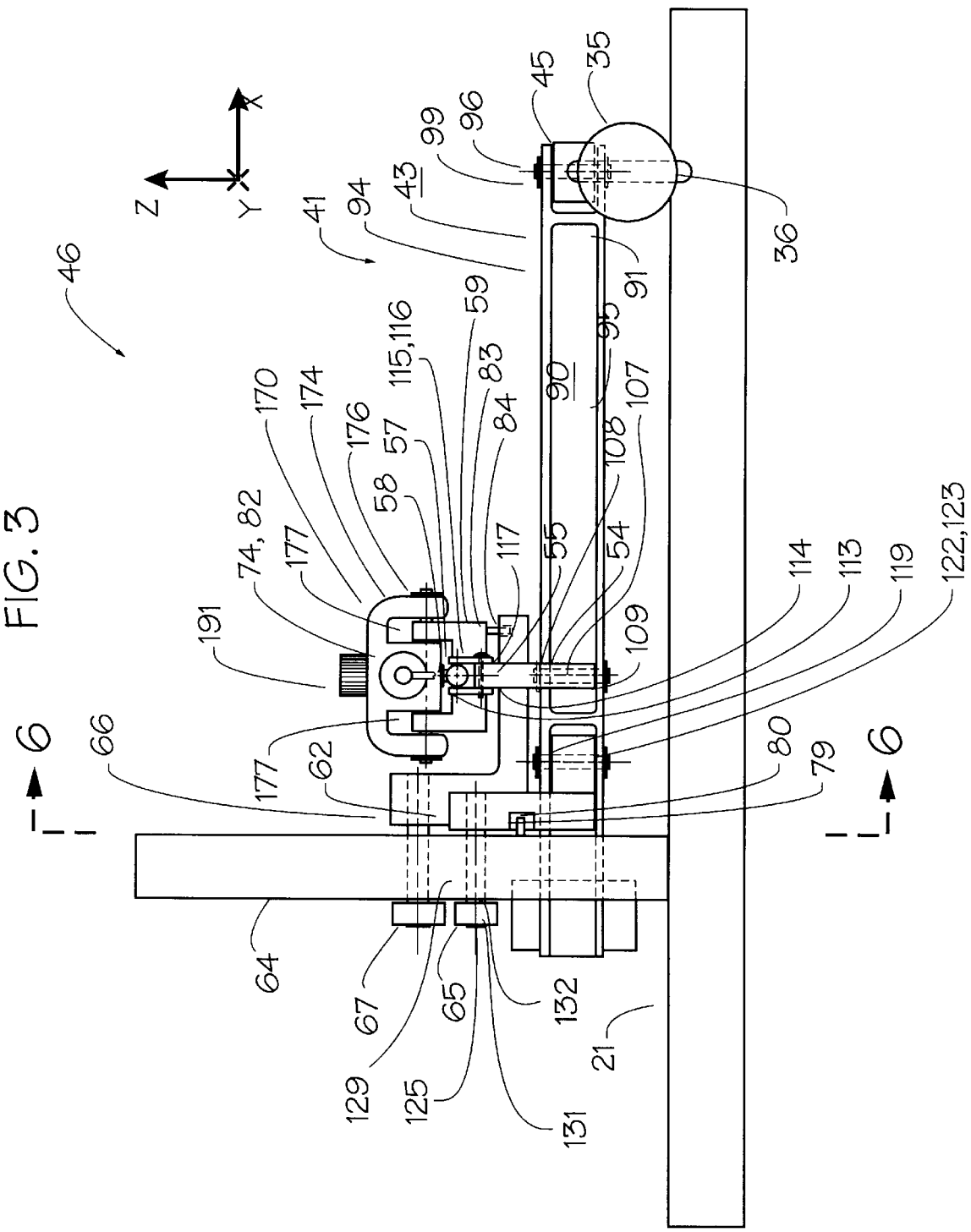

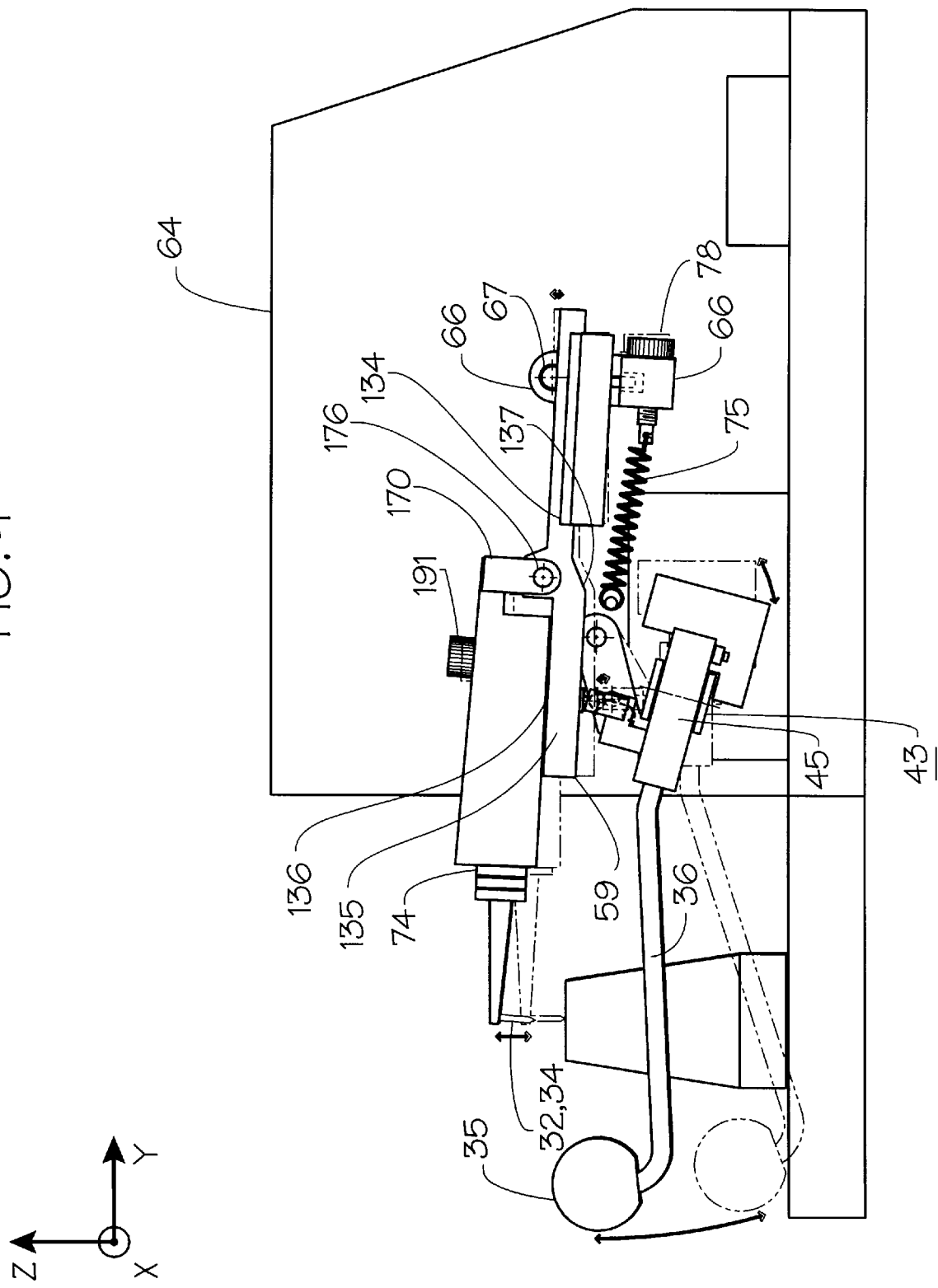

ULTRASONIC BONDING METHOD AND APPARATUS WITH LOCKING TOOL TIP

BACKGROUND OF THE INVENTION

1. Field of the Invention

The present invention relates to machines useful for moving a tool or similar implement into contact with a workpiece. More particularly, the invention relates to a method and apparatus including a micropositioner for positioning the tip of an ultrasonic or similar wire bonding tool at precisely determinable locations relative to a microcircuit or similar workpiece, moving the tip into contact with the workpiece to form a bond, locking the tip against motion in at least one direction during formation of the bond, and withdrawing the tip upon completion of a bond.

2. Description of Background Art

The invention of the transistor in 1948 may well have been the most important technological development of the 20th century. Substitution of transistors for vacuum tubes made it possible to construct computers of substantially reduced size and cost, much greater speed and data handling capability, and greatly reduced power consumption than vacuum tube computers. In the latter part of the 1950's, transistors were introduced to a wide variety of military, industrial and consumer products.

In the early 1960's, integrated circuits were introduced. Integrated circuits contain a number of transistors and interconnecting circuit elements which together comprise an operable electronic circuit, such as a logic element, amplifier, or memory element. While the first integrated circuits contained just a few transistors, integrated circuits are now being manufactured which contain tens or even hundreds of thousands of transistors on a single semiconductor die or chip.

Integrated circuits are fabricated from thin slices of a semi-conducting material such as silicon, germanium or gallium arsenide. The slices are cut into small squares or rectangles referred to as chips or dice, ranging in size from squares about 100 mil. (0.100 inch) on a side to several hundred mils. on a side. Transistors, diodes, resistors and interconnecting circuit paths are formed on the chip or die by diffusing impurities into selected regions of the chip, and by depositing various conducting paths and insulating layers onto the chip.

After a semi-conductor chip or die has been fabricated as described above, it must be attached to a base or carrier forming part of a package or container to protect the delicate die from damage. Prior to packaging, conductive pads providing input and output ports to the die must be electrically interconnected to more robust leads or terminals which extend outward through a container or package used to enclose the die. These interconnections are customarily made using fine aluminum or gold wires which are ultrasonically or thermosonically welded to the pads and leads by a bonding tool that applies ultrasonic energy, or a combination of heat and ultrasonic energy, to a bonding site. Since the connection pads of a microcircuit are extremely tiny and closely spaced, great precision is required in positioning the tip of a bonding tool relative to the microcircuit.

In response to a perceived need for an apparatus capable of precisely positioning the tip of an ultrasonic transducer used to form wire bonds on microcircuit chips, the present inventor invented a micro-positioner apparatus employing a novel pantograph-type manipulator input mechanism. That apparatus which was disclosed in the inventor's U.S. Pat. No. 3,474,685, that issued on Oct. 28, 1969, has proven to be highly effective in performing its intended function, and wire bonding apparatus employing the novel design concepts of the pantograph mechanism disclosed in that patent are used widely throughout the industry. However, the present inventor found that certain aspects of the micropositioner disclosed in the U.S. Pat. No. 3,474,685 patent might be improved upon. For example, the allowable working or throat depth of the ultrasonic tool tip would preferably be larger. Also, the use of offset pivotable mountings for the transducer tool plate would desirably be minimized, thereby minimizing the requirement for springs to counter balance unbalanced forces exerted in supporting the tool plate by offset mountings. Moreover, it would be desirable to have a micropositioner apparatus in which various ultrasonic transducers and other bonding tool accessories such as wire spooling mechanisms, some of which might be substantially heavier than conveniently supportable by prior art micropositioners, could be used. Such a need arises, for example, in bonding the heavier wires required for connection to various electronic components such as wound coils. In response to those considerations, the present inventor disclosed a Micropositioner For Ultrasonic Bonding, in co-pending U.S. patent application Ser. No. 08/773,637, filed Dec. 24, 1996.

However, in bonding insulated wires using ultrasonic transducers, an additional problem has existed with prior art bonding machines. Thus, when bonding an insulated wire to a microcircuit pad or device package lead, ultrasonic heating energy supplied by the tip of an ultrasonic bonding tool to form a bond must first melt insulation covering the wire prior to welding the wire to the pad or lead. Melting of bonding wire insulation typically requires about 300 milliseconds. This period is substantially longer than the 30-millisecond period typically required for welding bare wire. Therefore, even experienced operators of ultrasonic bonding machines, who have developed the requisite motor skills to position and maintain the tip of an ultrasonic bonding tool for a time interval sufficient to bond a bare wire to a bond site, tend to move the tip too soon after initiation of electrical drive power to a transducer to bond an insulated wire to a bond site. This premature movement can result in formation of a defective bond.

Although premature movement of the bonding tool tip in any direction can adversely affect ultrasonic bond formation, the present inventor has determined that premature motion in the up and down or z-axis direction is the most problematic, with longitudinal y-direction motion nearly as problematic, and motion in a lateral or x-direction somewhat less problematic. The present invention was conceived of to alleviate the aforementioned problems.

OBJECTS OF THE INVENTION

An object of the present invention is to provide an improved method of bonding insulated wire to a bond site by the application of ultrasonic energy and/or heat, the improvement comprising immobilizing in at least one spatial direction the tip of an ultrasonic bonding tool which forms the bond, during the duration of the bond formation.

Another object of the invention is to provide a micropositioner apparatus for moving the tip of an ultrasonic wire bonding tool to overlie a previously determined bonding site, moving the tip into contact with the bonding site to form a bond, locking the tip against motion in at least one direction during formation of the bond, unlocking the tip after formation of the bond, and withdrawing the tip thereafter.

Another object of the invention is to provide a locking device for ultrasonic bonding machines which immobilize the tip of an ultrasonic bonding tool in at least one spatial direction during formation of an ultrasonic bond.

Various other objects and advantages of the present invention, and its most novel features, will become apparent to those skilled in the art by perusing the accompanying specification, drawings and claims.

It is to be understood that although the invention disclosed herein is fully capable of achieving the objects and providing the advantages described, the characteristics of the invention described herein are merely illustrative of the preferred embodiments. Accordingly, I do not intend that the scope of my exclusive rights and privileges in the invention be limited to details of the embodiments described. I do intend that equivalents, adaptations and modifications of the invention reasonably inferable from the description contained herein be included within the scope of the invention as defined by the appended claims.

SUMMARY OF THE INVENTION

Briefly stated, the present invention comprehends an ultrasonic bonding method and apparatus in which the tip of an ultrasonic wire bonding tool is immobilized or locked during formation of a bond. In a preferred embodiment of the invention, a micropositioner apparatus is provided which includes means for moving the tip of an ultrasonic wire bonding tool to overlie a precisely determinable bonding location on the surface of a miniature microcircuit, moving the tip into contact with a bonding site to permit formation of a bond by application of ultrasonic energy to the bonding site, locking the tool tip against motion in at least one spatial direction during application of ultrasonic energy to the tool, releasing the tip upon completion of the bond formation, and withdrawing the tip from the bond site upon completion of the bond. The preferred embodiment of the locking apparatus according to the present invention consists of a locking mechanism attachable as an accessory to a micropositioner apparatus, thereby to controllably inhibit motion of the micropositioner in at least one of three spatial motion directions. Preferably, the micropositioner apparatus is of the type disclosed in co-pending application Ser. No. 08/773,637 which includes a manually operable manipulator input mechanism coupled by means of a ball joint to a follower mechanism including a tool support structure.

The manipulator input mechanism of the preferred micropositioner apparatus includes a generally laterally and horizontally disposed, laterally elongated four-bar parallelogram linkage or pantograph mechanism. The pantograph mechanism has long straight front and rear parallel beam members, and short inner and outer linkage members pivotably joined by four separate pivot bearings to the front and outer lateral ends of both front and rear beam members. The outer linkage member has protruding forward from an outer lateral end thereof a longitudinally disposed, laterally pivotable control arm. The control arm has at the outer longitudinal end thereof a hand control ball or knob which may be grasped between the fingers and thumb of a human operator. The pantograph mechanism includes an elongated straight front manipulator arm or beam having an inner end which protrudes laterally inwards from the four-bar structure, and which is pivotably mounted by means of a generally vertically disposed, pantograph mechanism support pivot bearing to a front, manipulator hanger crank. This pivot bearing allows motion of the manipulator arm in a longitudinal "Y" direction.

The manipulator hanger crank is in turn pivotably mounted to a vertical support plate by a horizontally disposed hanger crank support pivot bearing, thus allowing the manipulator hanger crank to pivot in a vertical plane, and thereby allowing the manipulator beam arm to be moved upwards and downwards in a "Z" direction in response to corresponding motions of the manipulator control knob.

The four-bar linkage of the pantograph mechanism includes a generally longitudinally and horizontally disposed short inner linkage bar which is pivotably coupled at the rear end thereof by a rear inner pantograph bearing to a laterally elongated straight tie bar which is disposed parallel to and rearward of the manipulator beam arm. In the preferred embodiment, the tie bar is the same length but of smaller cross-section than the manipulator arm. The short inner linkage bar comprises part of the long leg of a manipulator bracket having the shape of a "J" lying in a vertical plane on nits long leg, and is pivotably connected by means of a vertically disposed front inner pantograph pivot bearing to the pantograph manipulator arm. The manipulator bracket has a forwardly and upwardly protruding J-shaped section including a generally horizontally disposed portion of the long leg of the J, which protrudes forward through a cut-out front wall section of the manipulator arm. The manipulator bracket also has an upwardly protruding section, and an inwardly or rearwardly protruding section. The latter forms a coupling bar that partially overlies the manipulator beam arm and which protrudes rearward towards the front inner manipulator beam and pivot axis.

A vertically disposed ball joint socket protrudes upwards from the coupling bar and receives a ball that protrudes downwards from a tool support plate of a follower structure, the vertical axis of the ball joint being located forward of the front inner manipulator beam arm pivot axis. Lateral motion of the manipulator control knob in the "X", i.e., left and right directions causes the outer short linkage bar to pivot about the axis of a front outer pantograph bearing joining it to the manipulator arm, and the outer linkage bar to pivot about a rear outer pantograph bearing pivot axis joining it to the rear tie bar. Thus constructed, the pantograph mechanism forms a parallelogram having front and rear parallel long legs consisting of the front manipulator beam arm and rear tie bar, and short parallel sides consisting of the inner and outer short linkage bars. Lateral relative motion between the front manipulator arm and rear tie bar in turn causes the inner short linkage bar to pivot about the front inner pantograph bearing axis, thereby moving the ball joint socket in a lateral direction. This motion of the control knob in an X direction in turn causes the tool support plate, which is coupled by means of a downwardly protruding ball to the ball joint socket that protrudes upwards from the manipulator bracket, to also move in an X direction. Since the longitudinal distance between the control ball and outer manipulator bar pivot is about 16 times greater than the distance between the ball joint vertical axis and the inner manipulator bar pivot, displacement of the ball joint axis and attached point of the tool support structure in the X direction are about 16 times smaller than corresponding motion of the hand control ball. However, since the tip of a tool attached to and protruding forward beyond the front edge of the tool support plate swings through a larger radius arc than the ball joint, the ratio between control ball axis movement and movement of the tool tip is reduced to about 8:1.

Motion of the control knob in the Y direction, i.e., longitudinally inwards and outwards, results in motion of the ball joint axis in the Y direction. However, since the distance between the vertical pivot pin of the pantograph mechanism support bearing joining the inner end of the manipulator arm to the manipulator hanger, and the inner pantograph bearing pivot, is about one-eighth the distance between the inner and outer front pantograph pivots, displacement of the ball joint in the Y direction is about one-eighth that of the corresponding motion of the control ball.

Motion of the control ball in the z-axis direction, i.e., up or down, causes the pantograph manipulator arm and attached hanger to pivot about the horizontally disposed is of the hanger crank support pivot bearing joining the hanger to the vertical support plate. Since the longitudinal distance between the axis of the hanger crank support pivot bearing and the control ball is about eight times larger than the distance between the pivot axis and the vertically disposed ball joint axis, vertical motion of the tool support plate at this location is about one-eighth as large as vertical movement of the control knob. Because the radius arm for z-axis motions is the same as that for x-axis motions, this ratio is also multiplied by a factor of two, resulting in a 4:1 ratio.

The longitudinally inward or rear end of the tool support plate is slidably supported between a pair of linear roller bearings mounted on the upper surface of a tool support guide plate. The guide plate in turn is pivotably joined by a vertical pivot bearing to a tool support yoke, the latter bearing allowing pivotal motion of the rear portion of the tool support plate in response to lateral, or x-axis motion of the ball joint. The tool support yoke is pivotably mounted to the rear portion of the vertical support plate by means of a pivot bearing having a horizontally disposed axis. This bearing permits parallel motion in a vertical plane of the rear portion of the tool support plate in response to vertical, or z-axis motion of the ball joint.

When used to perform ultrasonic bonding, the micropositioner apparatus of the co-pending application is provided with an ultrasonic transducer mount fastened to the upper surface of the tool support plate. In this configuration, the transducer mount assembly holds a longitudinally elongated ultrasonic bonding implement that includes an ultrasonic transducer and impedance matching horn which protrudes longitudinally forward beyond the front end of the tool support plate, and an ultrasonic bonding tool having a tip which depends perpendicularly downwards from the outer end of the horn. In the preferred embodiment, the longitudinal line of action of the ultrasonic bonding tool tip along the Y axis, the Z axis of the tool support yoke pivot bearing, and the vertically disposed x-axis pivot bearing axis of the rear toot support plate all intersect at a common point. This novel arrangement assures that no cross coupling exists between motions in the three coordinate directions. Thus, motion solely in the X, Y or Z directions of the input manipulator coordinate system, in which motions of the control knob are measured, result solely in x, y, or z axis motions of the tool tip in a translated coordinate system.

According to the present invention, an ultrasonic bonding apparatus of the type described above is provided with a locking mechanism which limits motion of the ultrasonic bonding tool tip during formation of a bond. In a basic embodiment of the invention, motion of the tool tip in the up/down, z-axis direction is inhibited during bond formation. Preferably motion in the longitudinal, in/out y-axis direction is also inhibited, and motion in the lateral, x-direction may optionally be limited. Preferably, a separate locking mechanism or brake is provided for each orthogonal direction in which it is desired to inhibit motion during bond formation. Each brake is actuated in response to a bond initiation command signal, locking the tool tip against motion in particular coordinate directions prior to application of ultrasonic energy to a bond site, and maintaining the tip in that position for a period sufficient to melt wire insulation, weld the stripped wire to a bond site such as the microcircuit pad or lead, and allow the weld to cool and solidify. At the end of the bond formation command signal, which is a pulse of pre-determined length based upon the time required to melt bonding wire insulation and form a bond, the brake command signal is removed, allowing the tool to be moved to another bond site.

In a basic embodiment of the present invention, each motion brake consists of a pneumatically actuated piston attached to a first structural member. When actuated, the piston squeezes a flat leaf spring between the outer face of the piston, and a surface on a second structural member adjacent to and movable with respect to the first member. This arrangement functions somewhat like one-half of a vehicle disc brake, friction between the surface of the second member and one side of the leaf spring on one side thereof, and between the piston face and the other side of the leaf spring, inhibiting relative motion between the first and second structural members.

In one embodiment of the brake just described, a horizontally disposed pneumatic cylinder including a piston, and a leaf spring, are attached to the tool support yoke described above. Actuation of the piston presses the leaf spring against the adjacent vertical support plate, thereby locking the yoke against pivoting in a vertical plane, and thereby locking the ultrasonic transducer tool tip against vertical, z-axis motion.

In the preferred embodiment, a y-axis brake is also provided. The y-axis brake includes a vertically disposed pneumatic cylinder having an outer piston head which protrudes upwards through the upper surface of the tool support guide plate. A horizontally disposed leaf spring is also attached to the guide plate. Actuation of the piston presses the leaf spring against the lower surface of the tool support plate slidably mounted on the guide plate, thereby locking the tool support plate and ultrasonic transducer tool tip against in/out, longitudinal or Y-axis motion.

BRIEF DESCRIPTION OF THE DRAWINGS

FIG. 3 is a front elevation view of the apparatus of FIG. 2.

FIG. 4 is a right side elevation view of the apparatus of FIG. 2, showing the tool thereof in an elevated position.

DETAILED DESCRIPTION OF THE PREFERRED EMBODIMENTS

Referring now to FIGS. 1–11, a micropositioner apparatus according to the present invention is shown.

Figure 2A:
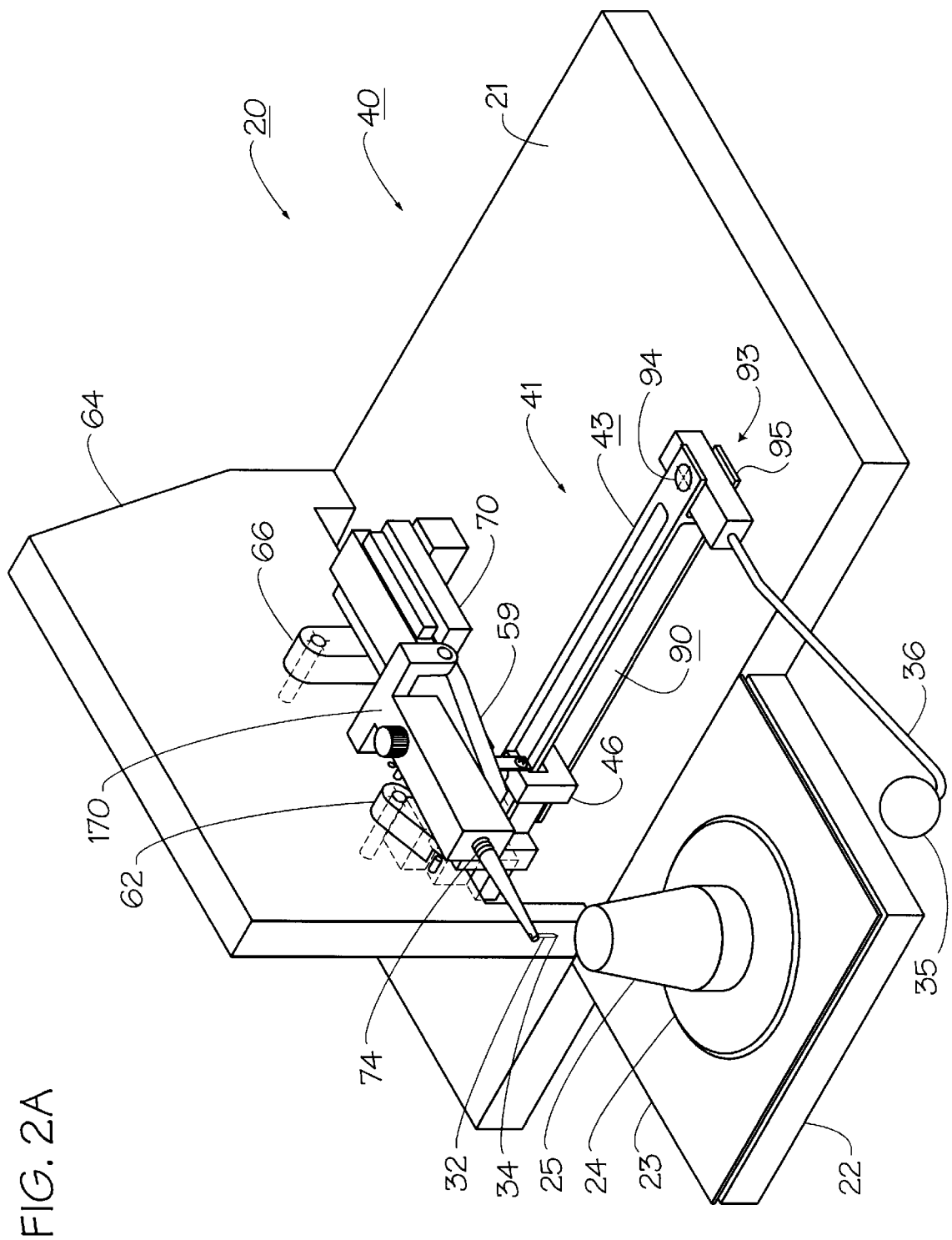
FIG. 2A is a right front upper perspective view of the micropositioner apparatus of FIG. 1.

FIG. 2 shows a micropositioner apparatus 40 according to the present invention, operably connected with other elements to comprise a complete manually operated ultrasonic bonding machine 20. The bonding machine is used to make ultrasonic wire bonds on miniature electronic components such as monolithic or hybrid microcircuits. Bonding apparatus 20 includes a base plate 21 on which is mounted on micropositioner apparatus 40, that is described in detail below. Base plate 21 has a forwardly extending rectangular extension 22 which supports a work table 23 that preferably includes a turntable 24 for rotatably supporting a pedestal 25, which in turn is used for holding a microcircuit or other workpiece.

Figure 1:
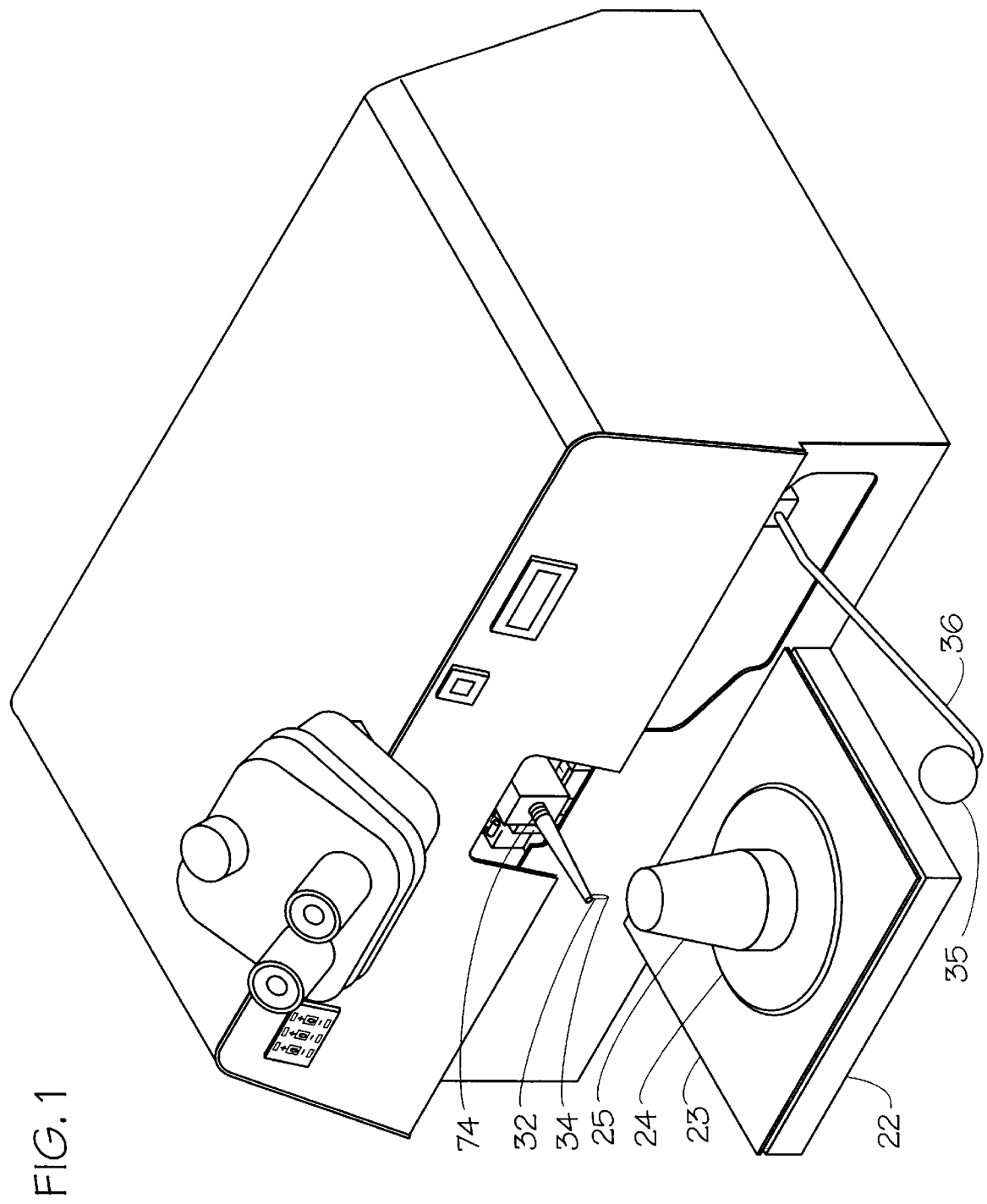
FIG. 1 is a front perspective view of a micropositioner apparatus for ultrasonic bonding according to the present invention, showing the apparatus in combination with other elements to comprise an ultrasonic bonding apparatus.

Referring to FIG. 1, ultrasonic bonding apparatus 20 may be seen to include a housing 26 having an upper panel 27 on which is mounted a stereoscopic microscope 28. Microscope 28 has a field of view which encompasses a microcircuit or other such workpiece A placed on the upper surface of pedestal 25. Housing 26 includes a front panel 29 on which are mounted various controls 30 such as switches, and indicating devices 31.

Ultrasonic bonding apparatus 20 includes an ultrasonic bonding implement 32 which includes a transducer tip and impedance matching horn 74A which protrudes forward through an opening 33 in front panel 29 of housing 26. An ultrasonic bonding tool 34 having a tapered tip on point 34A protrudes downwards from the outer end of transducer horn 74A. As will be described in detail below, bonding tool 32 is mechanically coupled to micropositioner apparatus 40, located within housing 26, the micropositioner affording means for precisely positioning the tip 34A of ultrasonic bonding tool 34 relative to workpiece A. Positioning of bonding tool tip 34A is accomplished by manually operating a control knob 35 attached to the outer end of a control arm 36 that protrudes longitudinally outwards from front panel 29 of housing 26, through an opening 37 in the front panel.

Referring now to FIG. 2, ultrasonic bonding apparatus 20 of FIG. 1 is shown with housing 26 removed, thereby revealing the micropositioner apparatus 40 according to the present invention. In FIG. 2 and the remaining figures, various electrical, electronic and mechanical components which operatively interact with micropositioner apparatus 40 have been deleted to facilitate an understanding of the novel and advantageous features of the micropositioner apparatus per se. The structure and function of the deleted items are clearly described in the present inventor's prior U.S. Pat. Nos. 3,474,685 and 5,163,728, and the description of those elements contained in the aforementioned patents are hereby incorporated by reference into the present specification.

Figure 9:
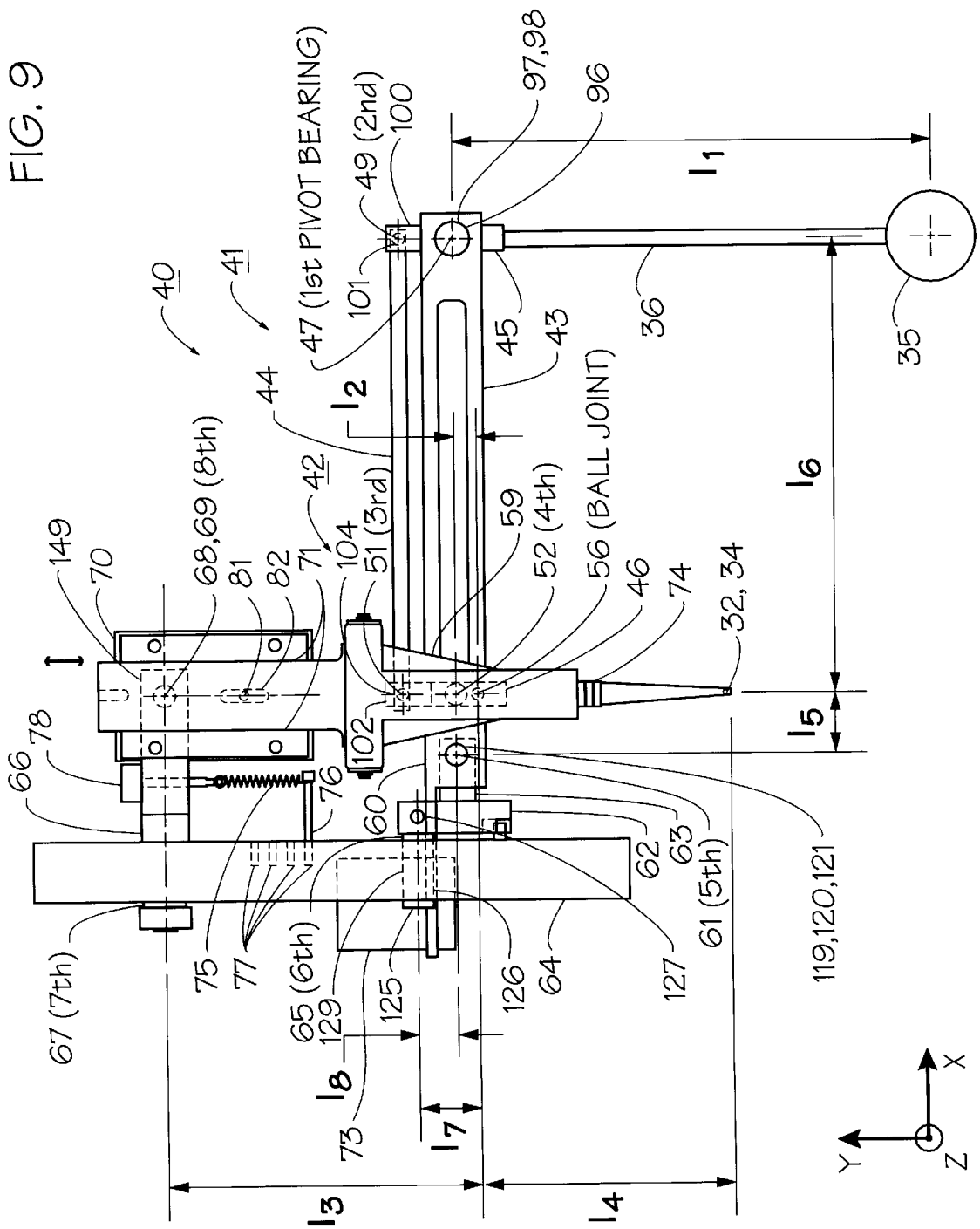
FIG. 9 is a diagrammatic upper plan view of the geometrical configuration of the apparatus of FIG. 2.
Figure 10:
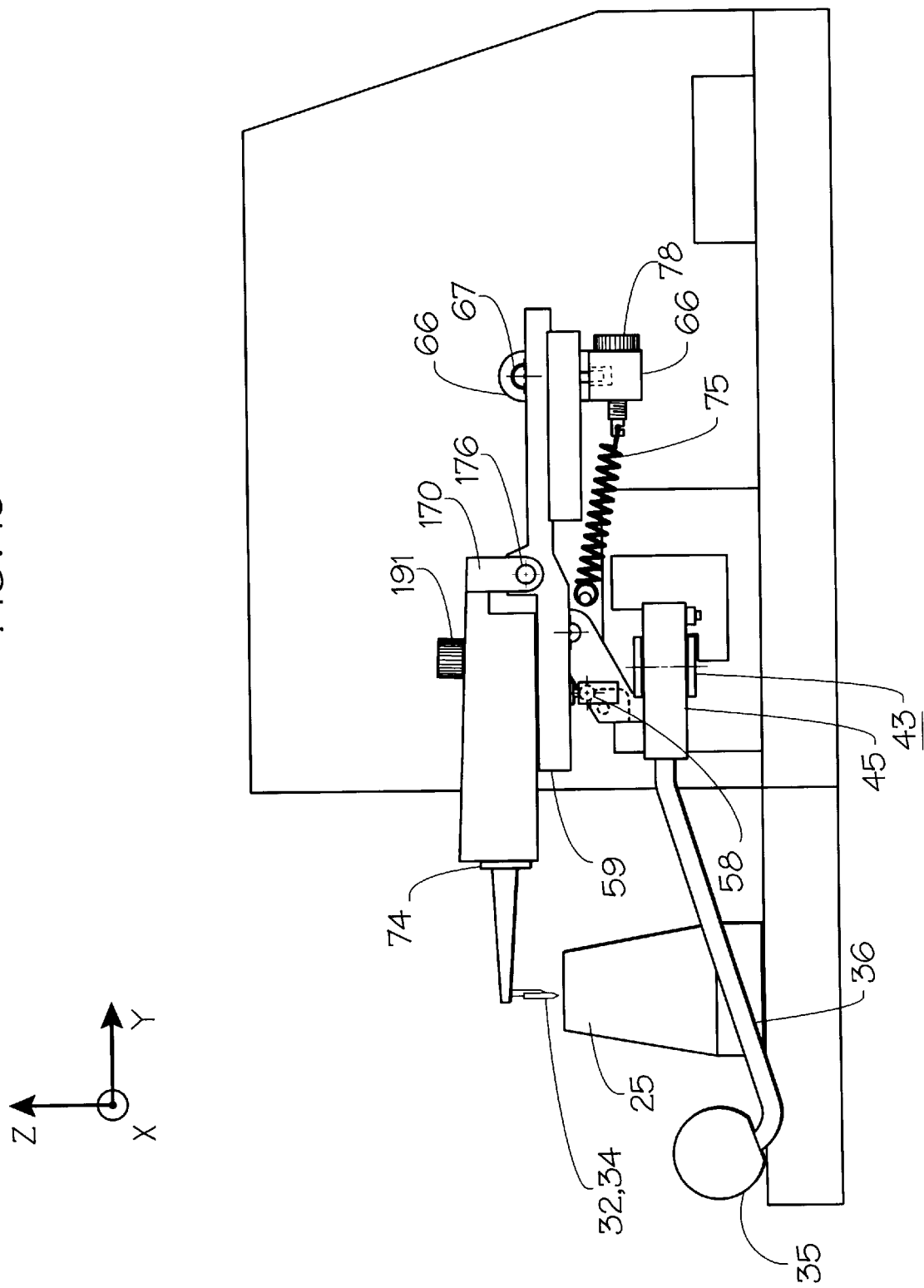
FIG. 10 is a diagrammatic right side elevation view of the geometrical configuration of the apparatus of FIG. 2.
Figure 11:
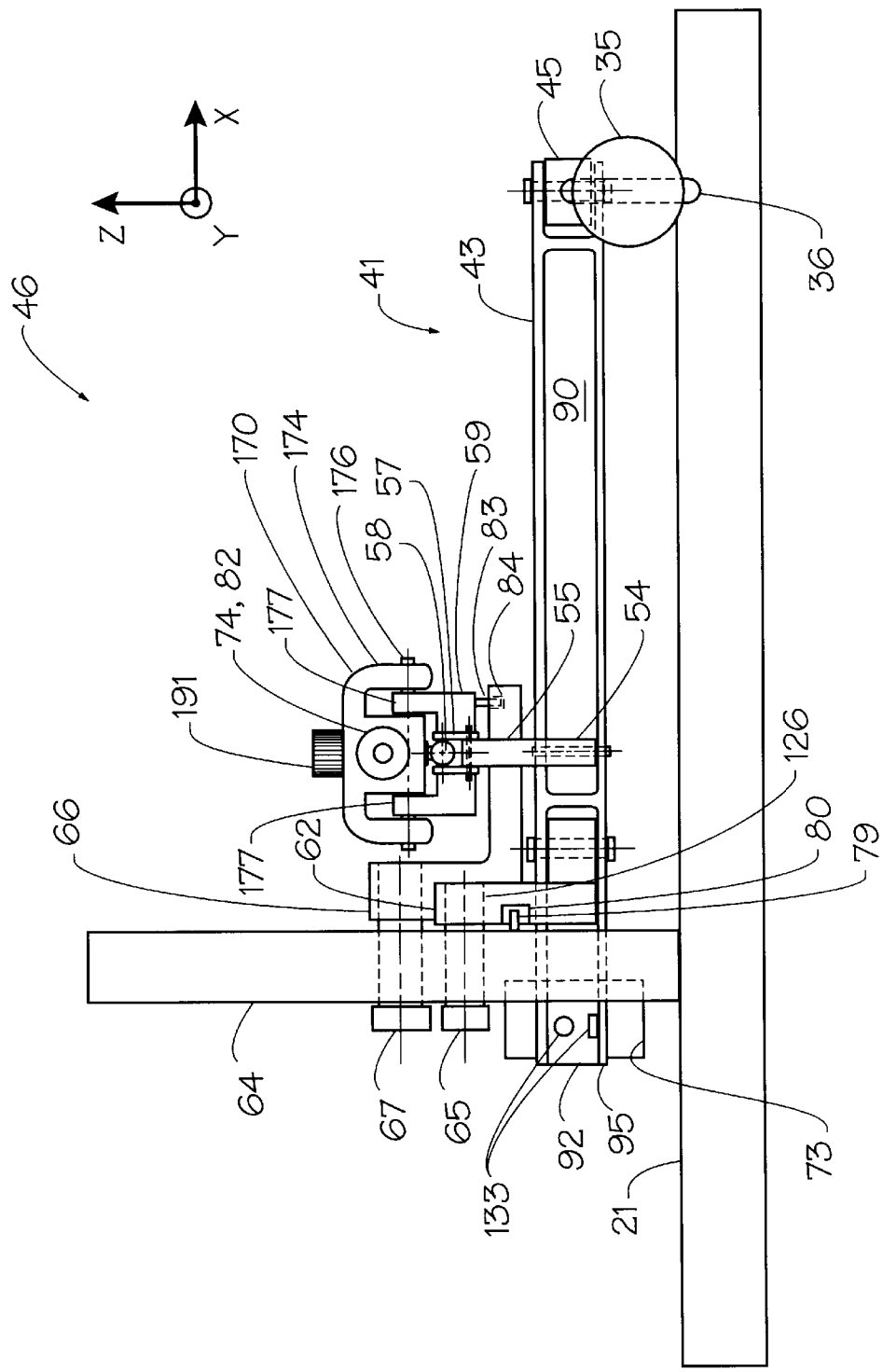
FIG. 11 is a diagrammatic front elevation view of the geometric configuration of the apparatus of FIG. 2.

The structure and function of the novel micropositioner 40 according to the present invention may be more readily understood by first reviewing certain geometrical relationships between various elements of the micropositioner apparatus. Referring now to FIGS. 9, 10 and 11, micropositioner apparatus 10 may be seen to include an input pantograph-like manipulator mechanism, designated generally by the element number 41, and a follower mechanism 42 for movably supporting and precisely positioning ultrasonic bonding tool 32. Input mechanism 41 includes a first, straight laterally disposed front manipulator arm or beam 43 of relatively large cross-section, and a straight rear tie bar 44 of equal length but smaller cross-section. Manipulator arm 43 and tie bar 44 are pivotably joined to form a four-bar, parallelogram linkage, by short, straight longitudinally disposed outer and inner linkage bars 45 and 46, respectively. Thus, as shown in FIG. 9, a first, front outer pantograph pivot bearing 47 having a pivot axis disposed perpendicularly to front manipulator arm 43 joins the front manipulator arm to short, longitudinally disposed outer linkage bar 45. The inner or rear end of outer linkage bar 45 is joined to rear tie bar 44 by a second, rear outer pantograph pivot bearing 49 having a pivot axis parallel to that of first pivot bearing 47. Outer linkage bar 45 has a portion that protrudes forward from first pivot bearing 47, beyond manipulator arm 43, where it is attached to the inner end of manipulator input control arm 36.

Referring still to FIG. 9, short inner linkage bar 46 of input pantograph mechanism 41 may be seen to be pivotably joined at an inner or rear longitudinal end thereof to the inner lateral end of tie bar 44, by means of a third, rear inner pantograph pivot bearing 51 having an axis parallel to those of pivot bearings one and two. Inner linkage bar 46 is also pivotably joined to manipulator arm 43 by a fourth, front inner pantograph pivot bearing 52 having a pivot axis parallel to those of bearings one, two and three. As may be seen best by referring to FIG. 10, inner linkage bar 46 also has a section 53 that protrudes forward beyond the front edge of manipulator arm 43, the forward protruding section having an upwardly protruding vertical leg section 54.

Vertical leg section 50 is joined at the upper end thereof by a rearwardly protruding horizontal coupling bar section 55 that partially overlies the upper wall surface of manipulator arm 43.

As may be seen best by referring to FIGS. 10 and 11 in addition to FIG. 9, upper coupling bar section 55 of inner linkage vertical bar 50 has protruding perpendicularly upwards therefrom a socket 57 for a ball joint 56. As shown in FIG. 9, the vertical axis of ball joint 56 is located forward of the axis of fourth, front inner pantograph pivot bearing 52. Ball joint 56 includes a ball 58 that protrudes downwards from a tool support plate 59.

Referring again primarily to FIG. 9, it may be seen that manipulator arm 43 has an extension portion 60 that protrudes laterally inwards to the left of fourth front inner pantograph pivot joint bearing 52. Extension 60 is pivotably joined by a fifth, manipulator arm support pivot bearing 61 to a laterally outwardly protruding lug 63 of a manipulator arm hanger 62. Fifth pivot bearing 61 is parallel to and longitudinally aligned with first and fourth pivot bearings 47 and 52.

As shown in FIGS. 9 and 11, manipulator arm hanger 62 is pivotably joined by a sixth, hanger support pivot bearing 65 to a vertical support plate 64 which protrudes upwards from base plate 21 of micropositioner apparatus 40. The axis of sixth pivot bearing 65 is oriented horizontally, i.e., parallel to base plate 21 and serves as the primary support member for manipulator arm 43 and the other previously described components of input pantograph mechanism 41.

Referring now to FIGS. 9 and 10, it may be seen that micropositioner apparatus 40 includes a rear tool support yoke 66 that is pivotably joined to vertical support plate 64 by a seventh, yoke support pivot bearing 67. That bearing has a horizontally disposed pivot axis. As shown in FIG. 9, rear tool support yoke 66 has a perpendicularly upwardly protruding pin 69 forming the pivot axis of an eighth, tool support pivot joint 68. That joint pivotably supports tool support guide plate 70, which in turn longitudinally slidably supports the rear portion of tool support plate 59, by a pair of laterally opposed, longitudinally disposed linear roller bearings 71.

As shown in FIGS. 9 and 10, the extension 60 of manipulator arm 43 protrudes laterally inward through a large aperture 72 provided through vertical support plate 64. A counterweight 73 located on the left side of vertical support plate 64 is attached to that portion of manipulator arm 60 that protrudes through aperture 72 in the support plate. One function of counterweight 73 is to exert a clockwise (as viewed from the right) moment about the horizontally disposed axis of hanger support pivot bearing 65, which rotatably supports hanger 62 of manipulator arm 43. The clockwise moment tends to equilibrate the counterclockwise moment exerted on manipulator arm 43 by the weight of control handle and knob 36 and 35, respectively. This counterbalancing action of counterweight 73 is also effective in the plane viewed from above in that its weight is disposed about the vertical pivot 61 opposite to the weight of the right portion of the manipulator assembly, items 30, 36, 45, and 43, and 50 counteracts the fore and aft change of tie moment arm of that weight about the horizontal pivot axis 65. Thus equilibrated, tool support plate 59 will tend to stay in a fixed up/down, or Z axis, position.

Since, as shown in FIG. 9, various ultrasonic bonding tools 34 and ultrasonic transducers 74 may be interchangeably mounted from time to time on tool support plate 59, micropositioner apparatus 40 preferably includes means for exerting an adjustable clockwise torque on manipulator arm 43 to compensate for heavier objects attached to the tool support plate. To this end, as shown in FIGS. 9 and 10, a tension spring 75 is provided which is attached at a forward end thereof to a headed screw 76 threaded into a selected one of a plurality of longitudinally aligned and spaced apart threaded holes 77 provided in the right side of vertical support plate 64. The rear end of spring 75 is attached to the shank of a thumbscrew 78 that protrudes forward through a threaded hole in rear tool support yoke 66. Coarse adjustment of z-axis balance of tool support plate 59 may be accomplished by selecting a particular hole 77 into which spring anchor screw 76 is threaded, while fine adjustment is accomplished by advancing or retracting the shank of thumbscrew 78, which is attached to the rear end of tension spring 75, by turning the thumbscrew in the appropriate direction.

As shown in FIG. 11, vertical axis motion of micropositioner apparatus 40 is limited in both up (plus) and down (minus) directions by a horizontally disposed z-axis limit pin 79 which protrudes laterally outward from vertical support plate 64, towards the right side thereof. Upward and downward motions of manipulator arm 43 are limited by contact of pin 79 with the lower and upper walls, respectively, of a slot 80 cut in the upper left side of manipulator arm hanger 62.

Micropositioner apparatus 40 also includes separate stop means for limiting x-axis and y-axis motions of tool support plate 59. Thus, as shown in FIG. 9, a longitudinal or y-axis motion limiting pin 81 protrudes upwards from tool support guide plate 70 into a longitudinally disposed slot 82 formed in the lower surface of tool support plate 59, the pin and slot combination providing limits on y-axis motion.

As may be seen best by referring to FIGS. 10 and 11, x-axis motion of tool support plate 59 is limited by contact of a cylindrical x-axis limit pin 83, which protrudes downwards from the lower right-hand corner of tool support guide plate 70, with the walls of an oversized cylindrical bore 84 provided in the upper wall surface of rear tool support yoke 66.

The novel construction of micropositioner apparatus 40 permits the tip 34 of ultrasonic bonding tool 32 to be moved in three different directions parallel to the orthogonal axes of an x, y, z coordinate system containing the tip, responsive and corresponding to motions of input manipulator control ball 35 in a different, X, Y, Z coordinate system. In the preferred embodiment, motions of the tool tip are small fractions of corresponding motions of the input control ball, thus permitting a person having ordinary tactile skills and accompanying hand jitters to precisely position and move tool tip 34 relative to a small workpiece. The ratios between motions of tool tip 34 to corresponding motions of control ball 35 may be calculated by reference to FIGS. 9, 10 and 11. These ratios are:

$$x/X = (l_2/l_1) \times (l_3 + l_4)/l_3$$

$$y/Y = (l_5/l_5 + l_6)$$

$$z/Z = [(l_8 + l_2)/(l_1 + l_8)] \times (l_3 + l_4)/l_3$$

By way of example only, the following dimensions and corresponding motion ratios have been found to be suitable:

$l_1 = 8$ inches
$l_2 = 0.4375$ inch
$l_3 = 5.25$ inches
$l_4 = 6.75$ inches
$l_5 = 1.071429$ inches $l_6 = 7.5$ inches
$l_7 = l_8 + l_2 = 0.50625 + 0.4375 = 1.0$ inch
$l_8 = 0.5625$ inches
$x/X = (0.4375 \div 8) \times (5.25 + 6.75) \div (5.25) = 1/8$
$y/Y = 1.071429/(1.07429 + 7.5) = 1/8$
$z/Z = [(0.5625 + 0.4375) \div (8 + 0.5625)][(5.25 + 6.75) \div 5.25] = 1/3.75$ Further details of the novel structure and function of micropositioner apparatus 40 according to the present invention may be better understood by reference to FIGS. 3–8 in addition to FIGS. 1 and 2 and 9–11, which were referenced above in conjunction with the foregoing description of certain geometric aspects of the apparatus.

Referring now to FIGS. 2 and 3–5, manipulator arm 43 may be seen to have the shape of a hollow, generally rectangular and preferably square cross-section beam. Preferably, the walls of manipulator arm 43 have elongated apertures 90 therein to reduce the weight of the manipulator arm. Also, the outer lateral ends of front and rear side walls 91 and 92 of manipulator arm 43 preferably have formed therein a laterally inwardly extending rectangular slot 93. The outer lateral ends of upper and lower side walls 94 and 95, respectively bounding slot 93 form a bifurcated structure having an opening which receives outer linkage bar 45. First, front outer pantograph pivot bearing 47 pivotably joining outer linkage bar 45 to manipulator arm 43 includes a pivot axle pin 96 that is received through vertically aligned holes 97 and 98 through the outer bifurcated end portions of upper and lower side walls 94 and 95 of manipulator arm 43, and is held therein by upper and lower E-rings 99 snapped into annular grooves 100 formed in the upper and lower ends of pivot axle pin 96.

Tie bar 44 of input pantograph mechanism 41 preferably consists of a thin, rectangular cross-section bar, the outer lateral end of which is pivotably fastened to the lower surface of a rear extension 100 of outer linkage bar 45 that protrudes rearward through slotted opening 93 in the outer lateral end of manipulator arm 43, by means of a headed pivot pin 101 which is received in aligned holes provided through the tie bar and into the bottom of the rear linkage bar extension, thus forming rear outer pantograph bearing 49. Similarly, the inner lateral end of tie bar 44 is pivotably attached to the lower surface of an extension portion 102 of inner linkage bar 46 that protrudes rearward through a laterally elongated, rectangularly-shaped aperture 103 provided through the rear side wall 92 of manipulator arm 43, near the inner lateral end of the manipulator arm. This third, rear inner pantograph pivot bearing is formed by a headed pivot pin 104 which is rotatably received through a clearance hole provided through the bar 44, and anchored in a blind bore provided into the bottom surface of rear extension 102 of inner linkage bar 46.

Inner linkage bar 46 also has a forwardly protruding section 53 that protrudes forward through a rectangularly-shaped aperture 106 provided through front side wall 91 of manipulator aim 43. The central portion of inner linkage bar 46 is pivotably joined to manipulator arm 43 by a fourth, front inner pantograph being 52. This bearing is comprised of a pivot axle pin 107 that is received through vertically aligned holes 108 and 109 through the upper and lower side walls 94 and 95 of manipulator arm 43. Pivot axle pin 107 is held in place by upper and lower E-rings snapped into annular grooves 110 formed in the upper and lower ends of pivot axle pin 107.

Figure 2B:
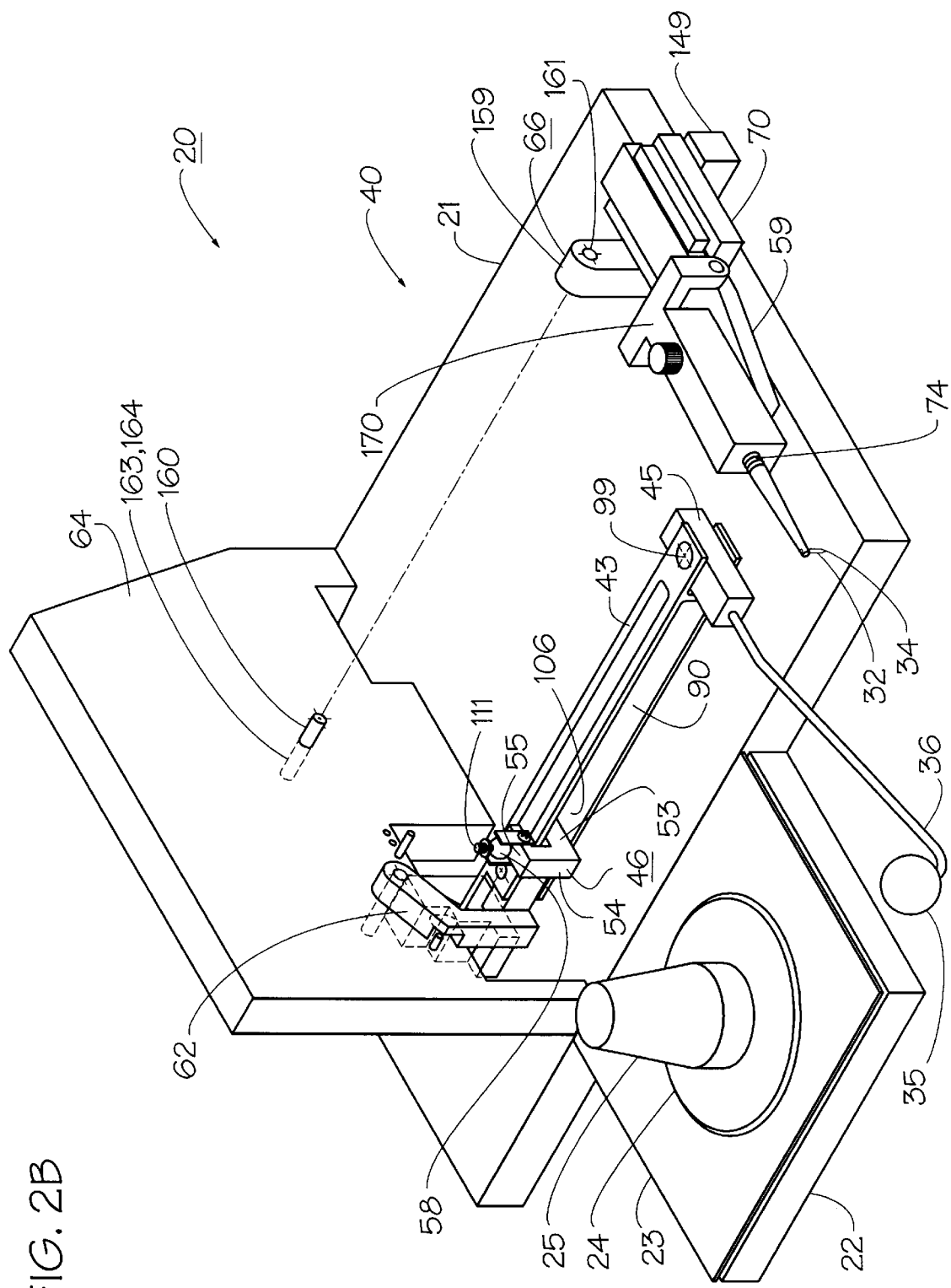
FIG. 2B is an exploded front perspective view of the apparatus of FIG. 1.
Figure 5:
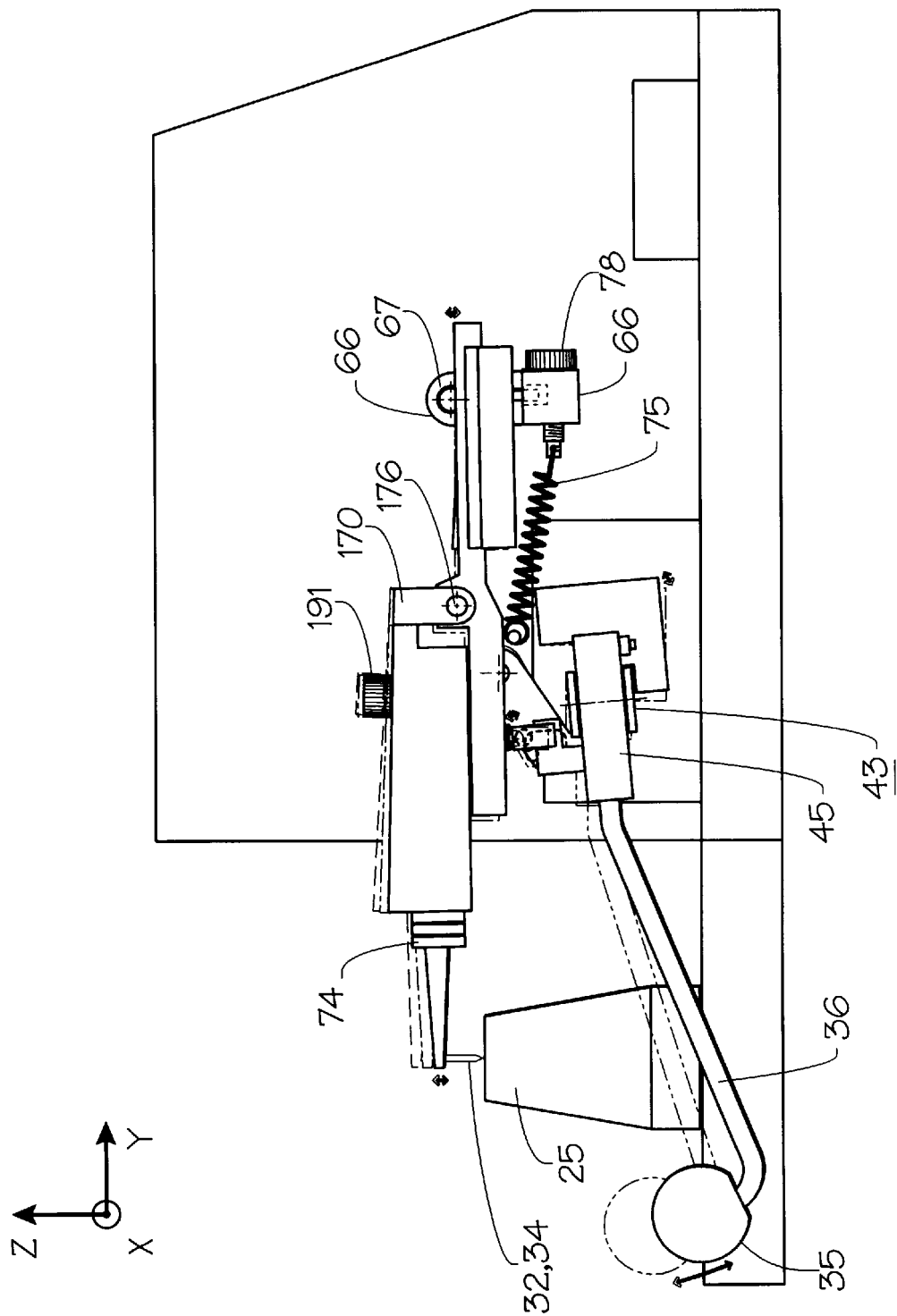
FIG. 5 is a view similar to that of FIG. 4, but showing the tool thereof lowered to a bonding position.

As shown in FIGS. 2B and 10, forwardly protruding section 53 of inner linkage bar 46, which protrudes forward through aperture 106 in front wall 91 of manipulator arm 43, is terminated at the outer or forward end thereof by a perpendicularly upwardly protruding, vertical leg section 54. Vertical leg section 54 is terminated at the upper end thereof by a horizontally disposed, rectangular-shaped section 55 that protrudes upwardly rearward to partially overlie manipulator arm 43, and spaced above the upper wall 94 of the manipulator arm.

As may be seen best by referring to FIGS. 2B and 3, upper section 55 of inner linkage bar 46 serves as a coupling bar for coupling input pantograph mechanism 41 to follower mechanism 42, by means of a ball joint type coupling 56. As shown in FIGS. 2B and 11, ball joint coupling 56 includes a ball 58 having a stud 111 which is lockingly received in the lower wall surface 112 of tool support plate 59,. Ball 58 is received in a socket 57 that protrudes upwards from coupling bar portion 55 of inner linkage bar 46. Socket 57 is formed by the combination of a rigid, hardened steel plate 113 having formed therein a concave depression in an inner surface therein and attached to the left side wall 114 of coupling bar 55, and a steel leaf spring 115 backed by a rigid steel plate 116 and attached to the right side wall 117 of the coupling bar.

Referring now to FIGS. 6, 7, 9 and 11, it may be seen that manipulator arm 43 has a left lateral end portion or extension 60 that protrudes laterally inwards to the left of fourth, front inner pantograph bearing 52. Front wall 91, and the front portion of upper and lower walls 94 and 95 of the inner end portion of left lateral extension 60 of manipulator arm 43 are cut away to form a laterally rightward extending rectangular slot 118. The leftward protruding lateral ends of upper and lower side walls 94 and 95, respectively, form a bifurcated structure having an opening which receives rectangular cross-section lug 63 that protrudes laterally outwards from manipulator arm hanger 62. Fifth, pantograph mechanism support bearing 61 joining inner end 60 of manipulator arm 43 to lug 63 of manipulator arm hanger 62 includes a pivot axle pin 119 that is received through vertically aligned holes 120 and 121 through the bifurcated end portion of upper and lower side walls 94 and 95 of the manipulator arm. Axle pin 191 is held in place by upper and lower E-rings 122 mapped into annular grooves 123 formed in the upper and lower ends of the pivot axle pin. Thus constructed, manipulator arm beam 43 may be pivoted rearward about hanger lug 63, since front wall 91 adjacent to slot 118 is cut away. However, since rear wall 92 of manipulator arm beam 43, as well as rear portions of upper and lower side walls 94 and 95 of arm extension 60 protruding leftward beyond slot 118 are left intact, rearward pivot motion of the manipulator arm is made possible by providing a laterally elongated, rectangularly-shaped aperture 124 through rear wall 92 of the beam, rearward of hanger lug 63, the aperture allowing rearward movement of the hanger lug therethrough.

As shown in FIGS. 2B, 6, 7 and 11, manipulator arm hanger 62 is pivotably joined by sixth, hanger support bearing 65 to vertical support plate 64. Bearing 65 comprises an axle pin 125 that protrudes laterally through a bore 126 inward to the left of manipulator hanger 62, the axle pin being held fixed by means of a set screw 127 screwed into a threaded bore that intersects the axle pin bore. Axle pin 125 is rotatably held in a journal 129 that is in turn held within a bore 130 through vertical support plate 64. Axle pin 125 is maintained in a fixed longitudinal position by means of a clamp 131 which grips the axle pin. Clamp 131 has an annular face which bears against a friction adjusting washer 132, the opposite annular surface of the washer bearing against the inner annular end wall of journal 129.

As may be seen best by referring to FIGS. 6, 7, 9 and 11, rear wall portion 92 and cut-back upper and lower walls 94 and 95 of inner extension 60 of manipulator beam 43 protrude laterally inward through a large, generally rectangularly-shaped aperture provided through the front portion of vertical support plate 64. Here the end portions of the lower and rear beam side walls are fastened by screws 133 to the front wall surface of counterweight 73, which has a two-step, stairway-like front surface, and a uniform lateral thickness.

Figure 8:
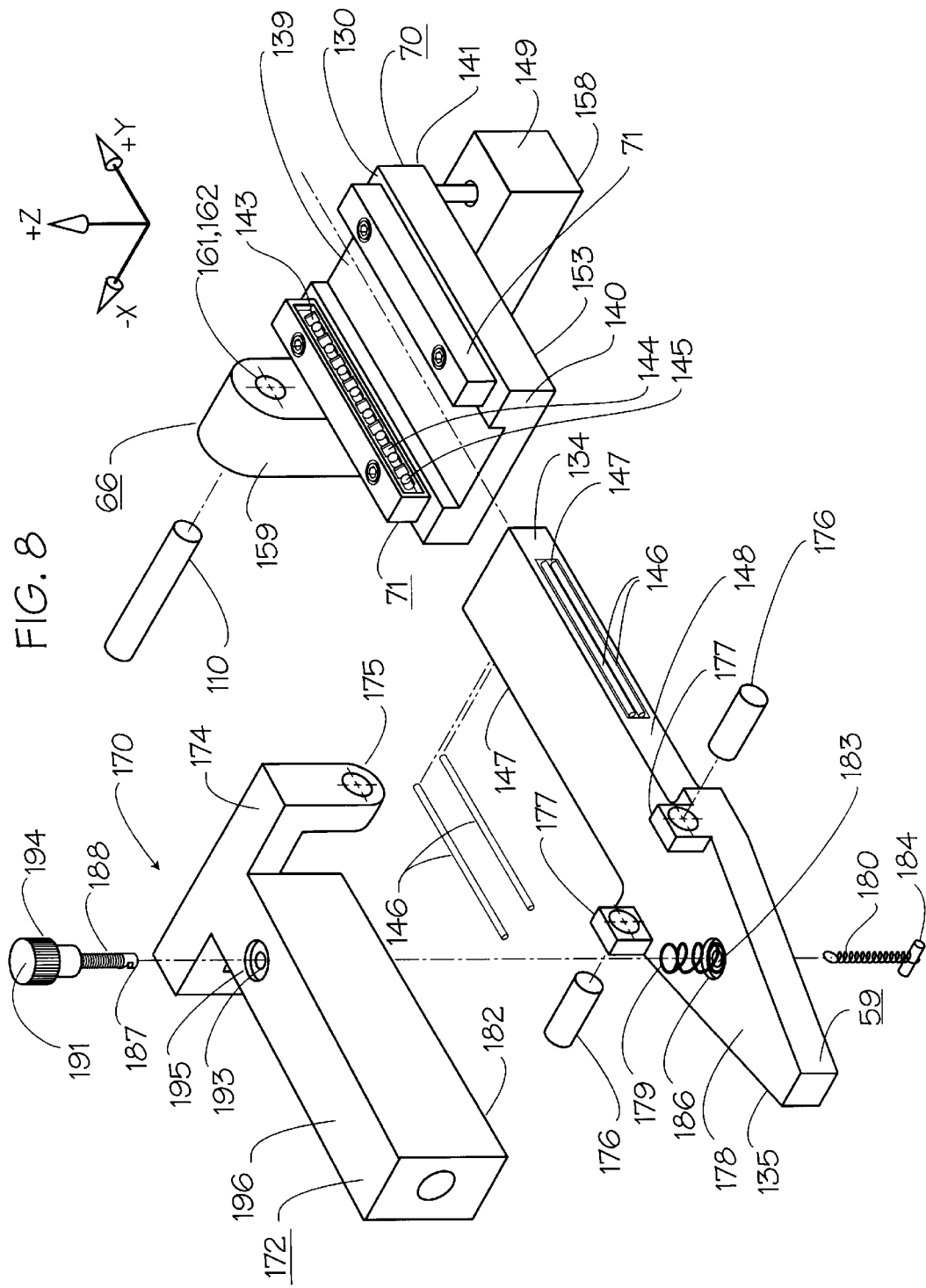
FIG. 8 is an exploded fragment perspective view of the apparatus of FIG. 2, showing a linear bearing thereof.

As may be seen best by referring to FIGS. 8 and 9, tool support plate 59 has in plan view the shape of longitudinally elongated, rectangular rear plate section 134, and an arrowhead-shaped front section 135. As may be seen best by referring to FIG. 4, rear rectangular plate section 134 of tool support plate 59 is of generally uniform thickness, while the front arrowhead-shaped section 135 is somewhat thicker, and has downwardly stepped upper and lower parallel walls 136 and 137, respectively.

Figure 7:
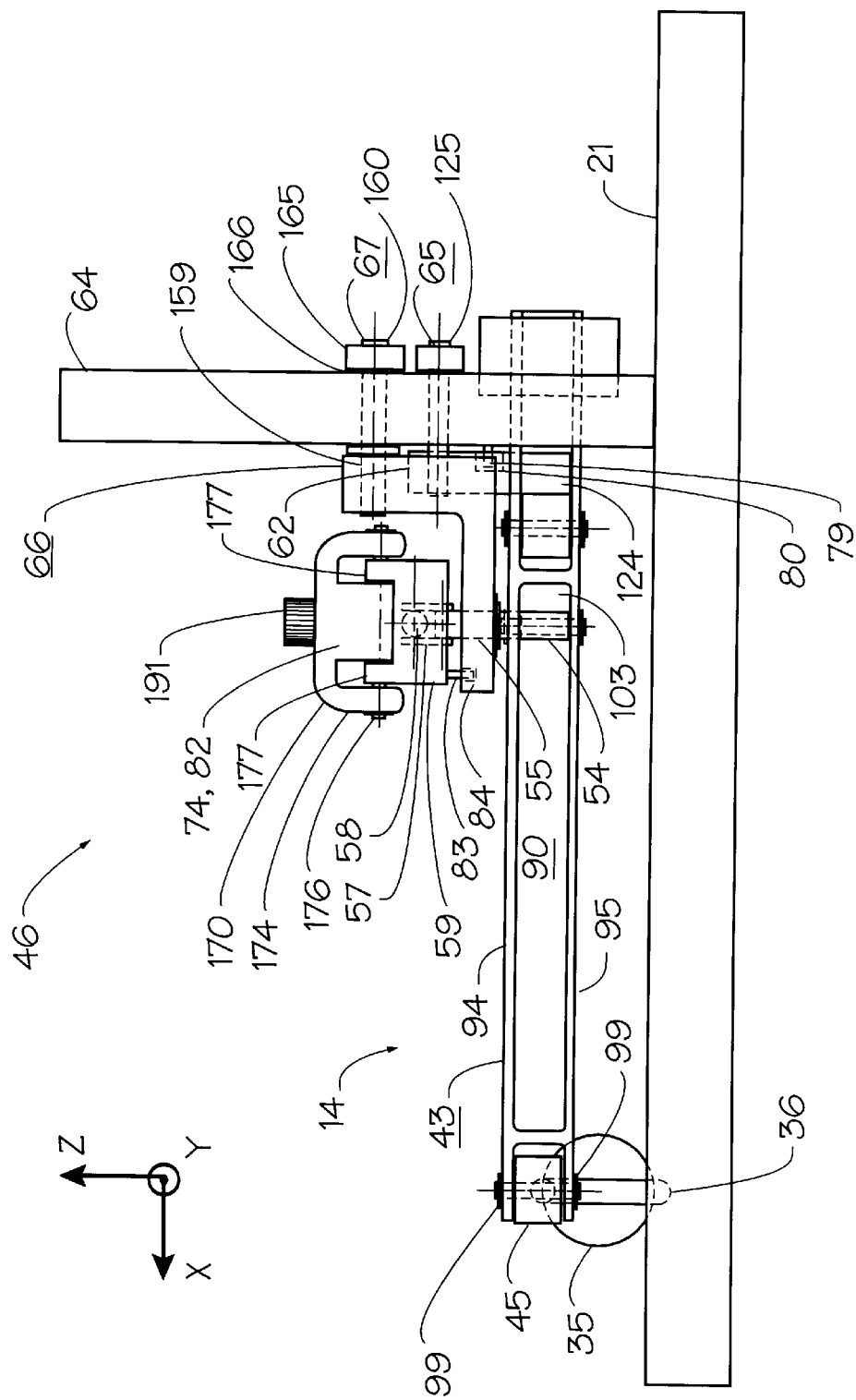
FIG. 7 is a rear elevation view of the apparatus of FIG. 2.

As shown in FIGS. 7, 8 and 9, rear plate section 134 of tool support plate 59 is slidably supported in tool support guide plate 70. Tool support guide plate 70 has in plan view a longitudinally elongated rectangular shape, that has formed in the upper wall 130 thereof of a longitudinally elongated, shallow, rectangular cross-section groove 139 which penetrates both the front wall 140 and rear wall 141 of the tool support guide plate. Groove 139 provides clearance for rear rectangular plate section 134 of tool support plate 59, which is longitudinally slidably supported by a pair of laterally opposed, longitudinally disposed linear roller bearings 71. Structural details of roller bearings 71 may be best understood by referring to FIG. 8. As shown in FIG. 8, roller bearings 71 have short cylindrical rollers 143 held by races 144 within elongated rectangular housings 145. Rollers 143 rollably contact a pair of vertically spaced apart, longitudinally disposed elongated cylindrical pins 146 made of hardened steel, and which are located in longitudinally elongated grooves 147 provided in side walls 148 of rear plate section 134 of tool support plate 59. Referring now to FIGS. 2B, 7, 9, 10 and 11, it may be seen that tool support guide plate 70 is rotatably supported on the laterally outwardly projecting leg 149 of yoke 66 by eighth, tool support pivot bearing 68. Tool support bearing 68 includes a downwardly protruding axle 150 which is fixed in a blind bore 151 provided in the lower surface of a cylindrical boss 152 which protrudes downwards from the lower wall 153 of tool support guide plate 70. Axle 150 is rotatably received through a journal 154 fixed in a bore 155 through horizontal yoke leg 149 of yoke 66, and longitudinally fixed by means of a clamp 156 and washer fitted over that portion of the axle which protrudes below lower wall surface 158 of the horizontal yoke leg.

As may be seen best by referring to FIGS. 2B and 7, tool support yoke 66 has an inner vertically disposed leg 159 that is pivotably joined by seventh yoke support bearing 67 to vertical support plate 64. Bearing 63 includes an axle 160 that is fixed in a bore 161 through the upper end of the vertically disposed yoke leg 159, the axle protruding laterally inward to the left of the yoke leg through a bushing 162. Axle 160 is rotatably held in a journal 163 that is fixed within a bore 164 provided through vertical support plate 64. Axle pin 160 is maintained in a fixed longitudinal position by means of a clamp 165 which grips the left end portion of the axle pin, a bushing 166 being positioned between the left wall 167 of the vertical support plate and the clamp.

Figure 6:
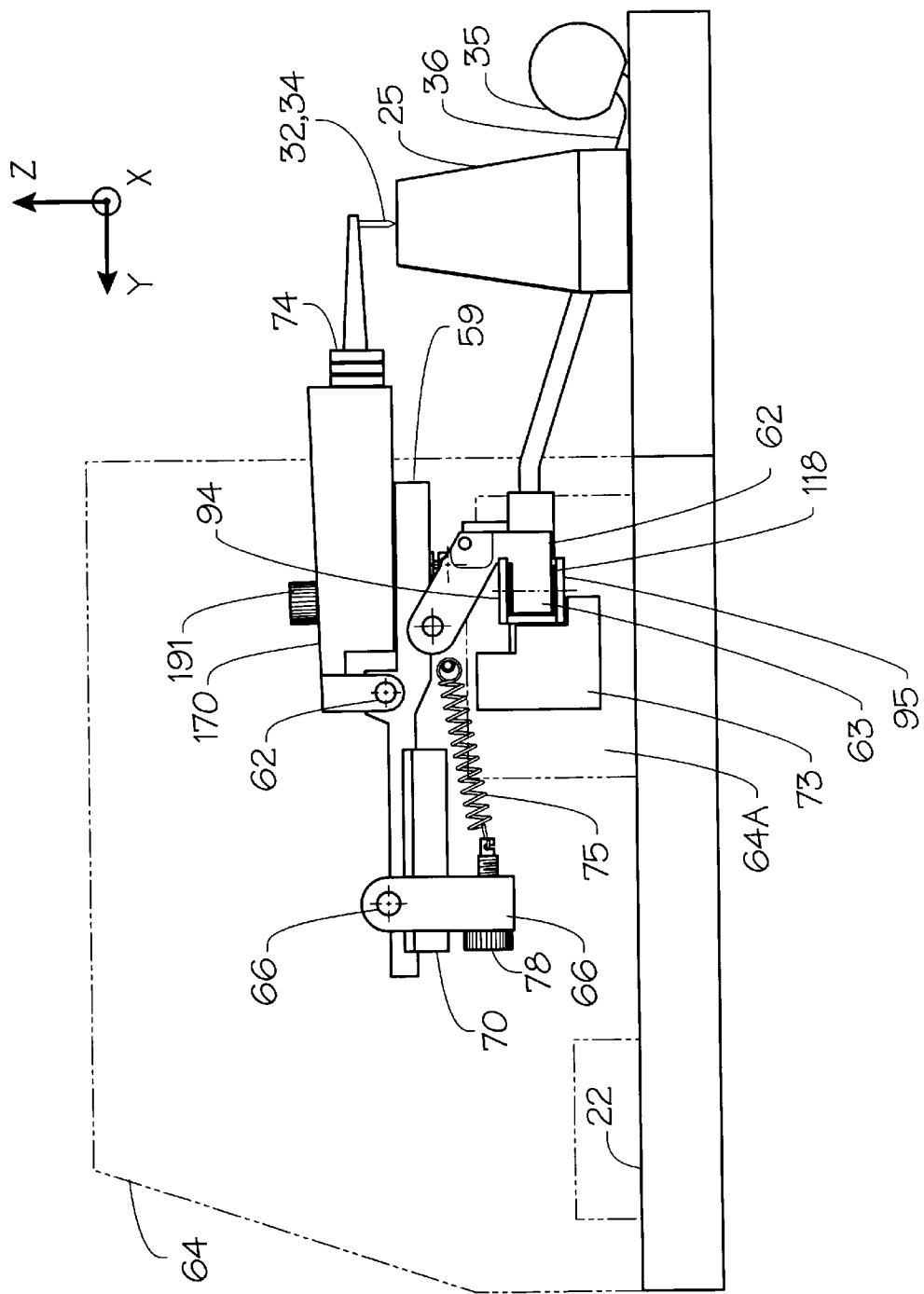
FIG. 6 is a left side elevation view of the apparatus of FIG. 2.

Referring now to FIGS. 2, 6 and 7, micropositioner apparatus 40 may be seen to preferably include a transducer mount assembly 170 for holding an ultrasonic transducer 74, and attached ultrasonic bonding tool 34. As shown in those figures, transducer mount assembly 170 includes a longitudinally elongated, generally rectangular cross-section body 172 having attached to rear wall 173 thereof an inverted U-shaped pivot yoke 174. The outer lower ends 175 of yoke 174 are attached to tool support plate 59 by a pair of laterally opposed and aligned pivot pins 176, which are in turn pivotably fastened to a laterally opposed pair of lugs 177 which protrude upwards from the upper surface 178 of tool support plate 59. Body 172 is thus allowed to pivot upwards in a vertical plane, in response to an upward reaction force exerted in response to downward pressure exerted on a workpiece by tip 34A of ultrasonic bonding tool 34.

In the preferred embodiment, body 172 of transducer mount assembly 170 is supported above upper surface 178 of tool support plate 59 by a pair of coaxial outer and inner coil springs 179 and 180, respectively. As may be seen best by referring to FIG. 8, outer spring 179 is an open coil, helical compression spring, the upper end of which fits in a counterbore 181 in lower wall surface 182 of body 172 of transducer mount assembly 170. The lower end of spring 179 is received in a counterbore 183 in the upper wall surface 178 of tool support plate 59.

Inner spring 180 is a closed coil helical tension spring, and is held at the lower end thereof by a transversely attached pin 184 which fits in a transverse notch 185 formed in the lower entrance of a bore 186 through tool support plate 59. The upper end of inner tension spring 180 is held in a slot 187 formed in the lower end of a threaded shank 188 a stud 189 which is threadably received in a threaded bore 190 of a thumbscrew 191, the latter having a reduced diameter portion 192 which fits down through a bore 193 provided through body 172. The enlarged head 194 of thumbscrew 191 is received on a the annular face of a counterbore 195 in upper wall surface 199 of transducer housing body 172.

The novel arrangement of compression spring 179 opposing coaxially enclosed tension spring 180 allows the downward force exerted by tool tip 34A on a workpiece to be limited to a value predetermined by adjusting the tension of spring 180, since tool tip 34A and transducer mount assembly 170 may pivot upwards with respect to tool support plate 59, on transducer mount pivot yoke pivot pins 176, in opposition to tension exerted by the tension spring.

In the preferred embodiment, upward pivotal motion of transducer mount assembly 170 in response to contact of tool tip 34A with a workpiece actuates an electronic switch 197 mounted on the upper surface 198 of support plate 59 and located below the lower surface 199 of the transducer mount assembly. Switch 197 is in turn used to initiate application of electrical drive power to transducer 171.

FIGS. 12–25 illustrate modifications of certain elements of the apparatus shown in FIGS. 1–11 and described above, as well as additional elements, which together embody a locking apparatus for ultrasonic bonding according to the present invention.

Referring now to FIGS. 12–18, a locking apparatus according to the present invention which is effective in ihibiting or braking z-axis or up/down motion of tip 34A of ultrasonic bonding tool 34, shown in FIGS. 1–11 and described above, will now be described.

Figure 13:
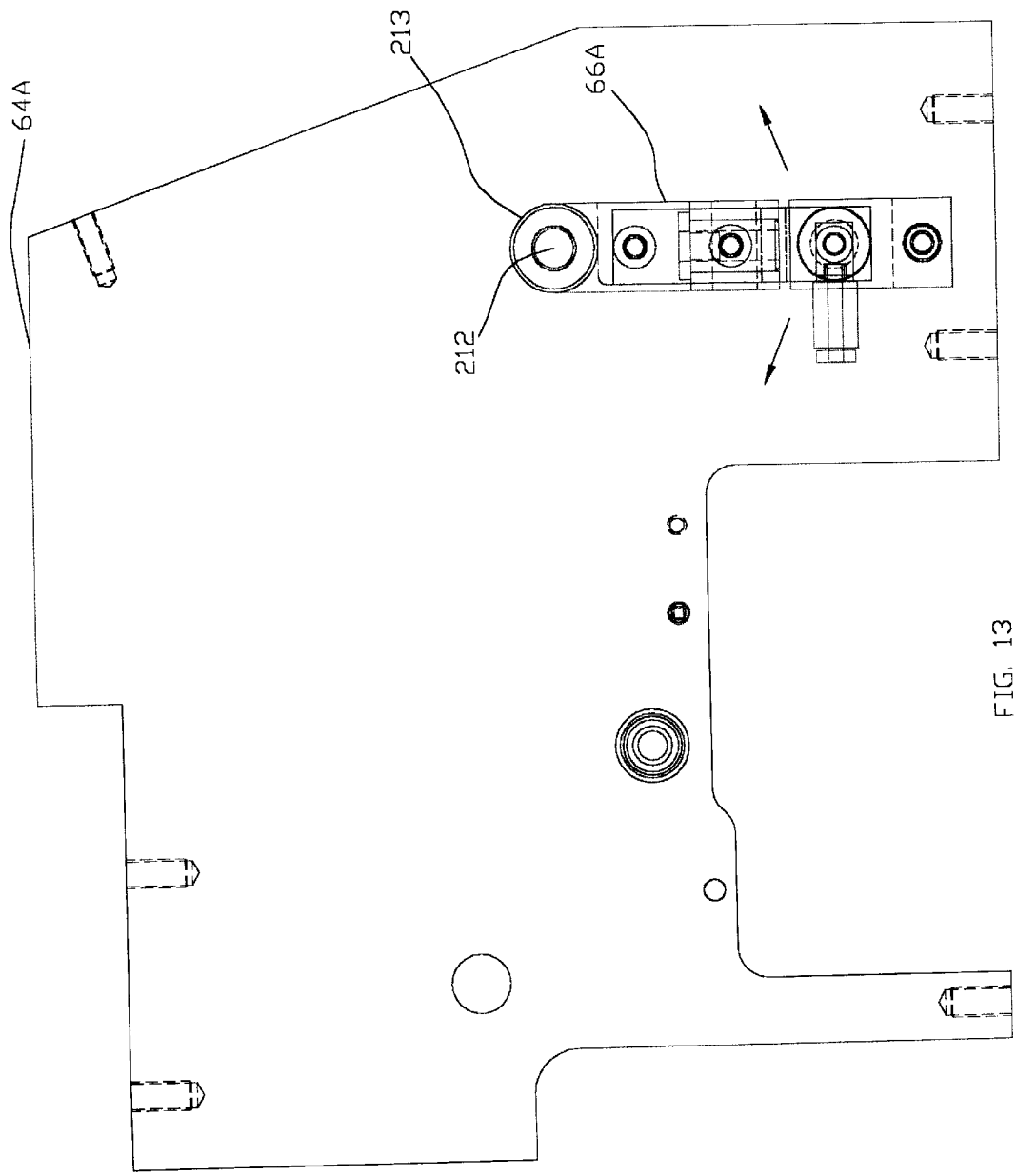
FIG. 13 is a right side elevation view of the structure of FIG. 12.
Figure 14:
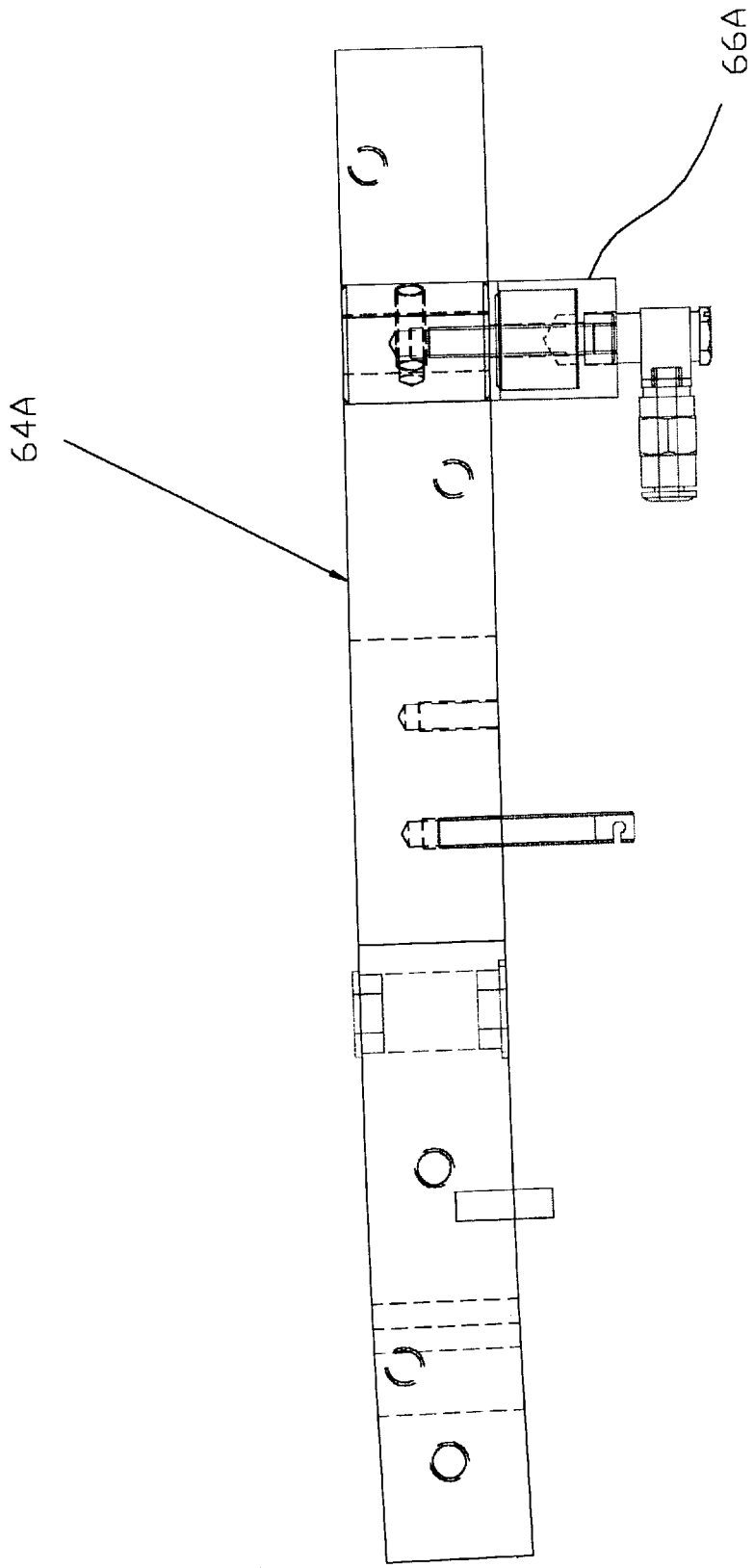
FIG. 14 is a fragmentary upper plan view of the structure of FIG. 12.
Figure 15:
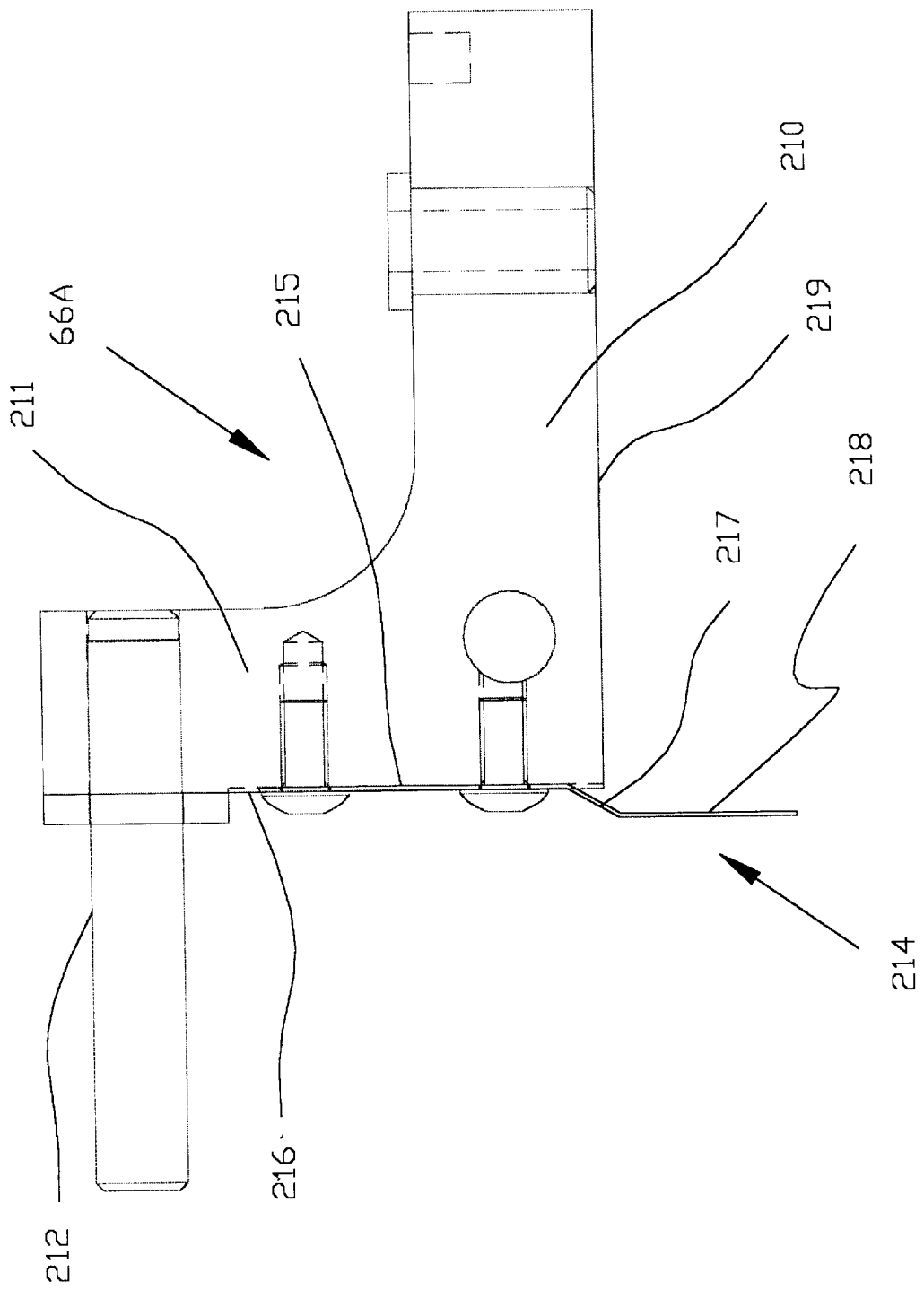
FIG. 15 is a front elevation view of a tool support yoke comprising part of the structure of FIG. 12.
Figure 16:
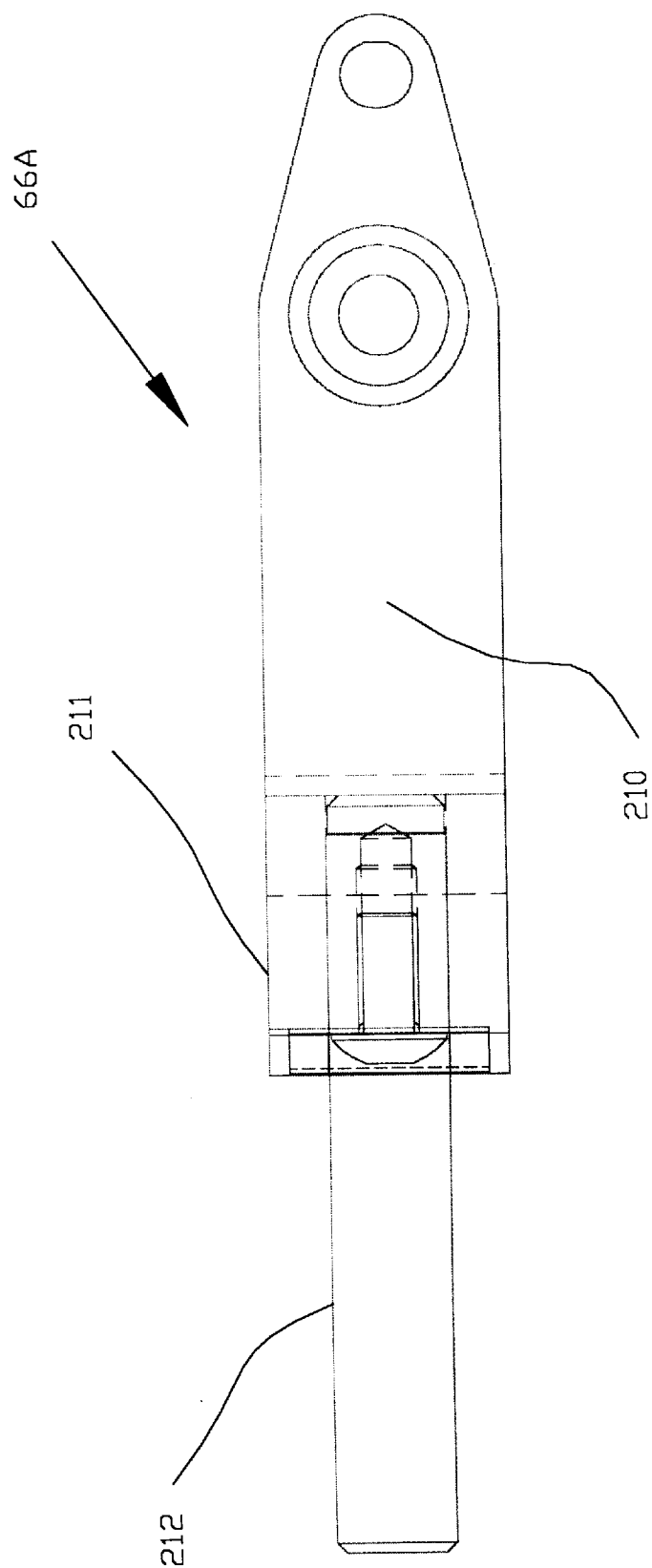
FIG. 16 is an upper plan view of the yoke of FIG. 15.

As shown in FIGS. 12–18, a z-axis locking brake 205 according to the present invention includes a vertical support plate 64A and rear tool support yoke 66A which are modifications of corresponding elements 64 and 66 shown in FIGS. 1–11 and described above. As may be seen best by referring to FIGS. 15 and 16, modified rear tool support yoke 66A has in front elevation view the overall appearance of an L-shaped bar having horizontally disposed leg 210 and a vertically disposed leg 211. As shown in FIGS. 15 and 16, rear tool support yoke 66A has a horizontally disposed cylindrical pivot pin or axle 212 that protrudes perpendicularly outwards from the left-hand face of vertical leg 211. As may be seen best by referring to FIGS. 12 and 13, pivot pin 212 of yoke 66A is rotatably supported by a bearing journal 213 which transversely penetrates the thickness dimension of modified vertical support plate 64A.

As may be seen best by referring to FIGS. 15 and 16, modified rear tool support yoke 66A differs from yoke 66 primarily by the addition of a leaf spring 214. As shown in those figures, leaf spring 214 has a rectangular plan view shape, including a relatively long, flat upper section 215 fastened in intimate contact with the outer flat vertical surface 216 of vertical leg 211 of yoke 66A. Leaf spring 214 also has a short intermediate section 217 that angles obliquely outwards and downwards from upper section 215. Also, leaf spring 214 has a relatively long flat, lower section 218 joining the lower end of oblique intermediate section 217. As shown in FIGS. 15, lower leaf spring section 218 is parallel to upper leaf section spring section 215, and displaced laterally outwards from outer flat vertical face 216 of vertical yoke leg 211. As is also shown in FIG. 15, intermediate and lower section 217 and 218 of leaf spring 214 protrude perpendicularly downwards beyond lower flat wall surface 219 of horizontal leg 210 of rear tool support yoke 66A.

Figure 12:
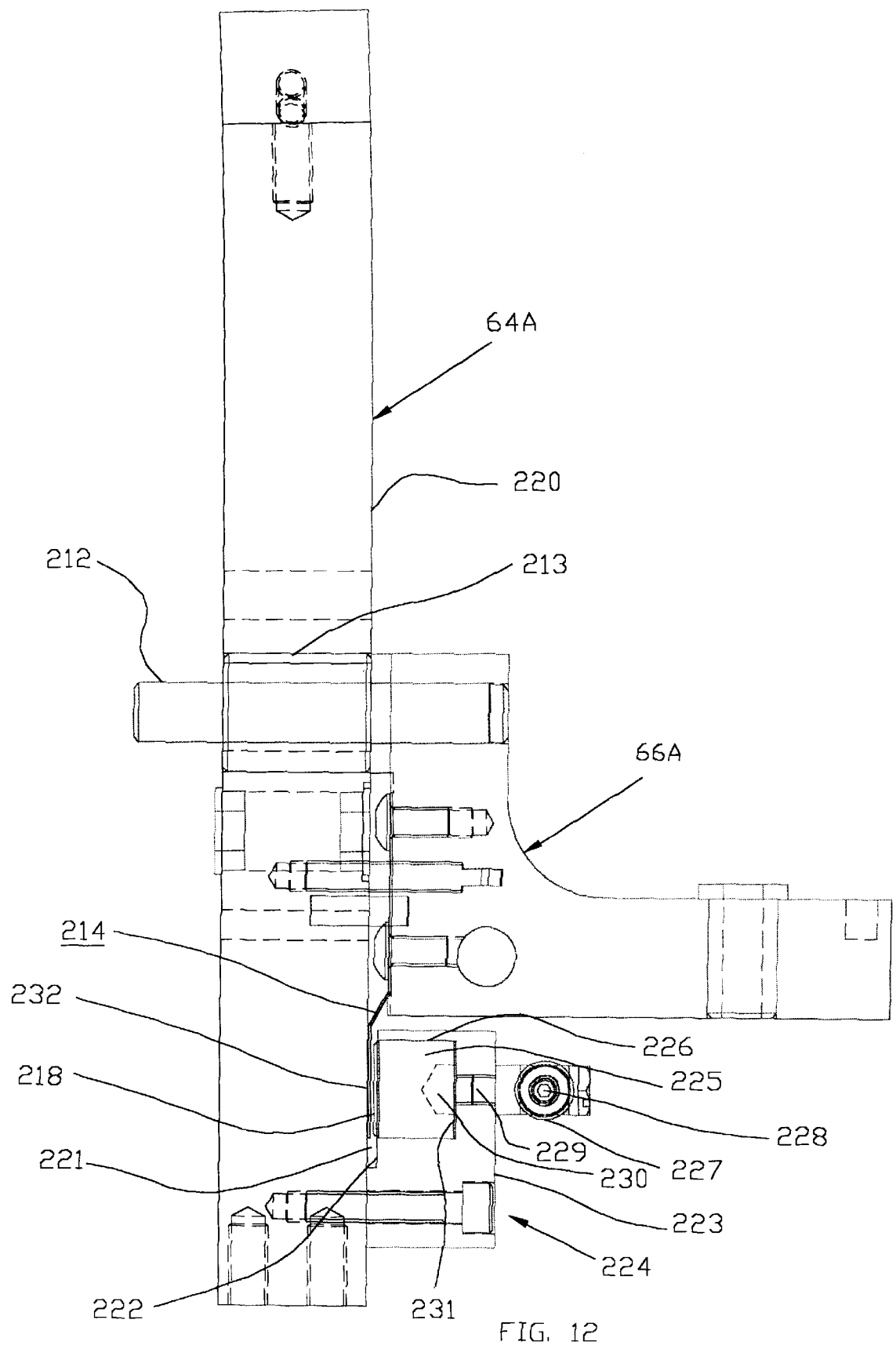
FIG. 12 is a fragmentary front elevation view of a modification of the apparatus shown in FIGS. 1–11.

Referring now to FIGS. 12–14, it may be seen that with rear tool support yoke 66A pivotably attached by axle pin 212 to vertical support plate 64A, lower leaf spring section 218 lies parallel to and nearly in contact with flat right-hand wall surface 220 of the vertical support plate. Thus positioned, lower leaf spring section also lies in a rectangularly-shaped slot 221 formed between the flat outer surface 222 of a rectangular block-shaped housing 223 of a pneumatic brake actuator 224.

As shown in FIG. 12, pneumatic brake actuator 224 includes a generally cylindrically-shaped piston 225 slidably mounted in a longitudinally disposed bore 226 in actuator housing 223. Actuator 224 includes an air inlet port fitting 227 having an air passageway 228 which communicates with an inlet bore 229 within housing 223. Inlet bore 229 communicates with piston bore 226, and is coaxial therewithin.

As shown in FIG. 12, a blind counterbored cavity 230 is formed coaxially in the front face 231 of piston 225. Cavity 230 functions as a plenum, allowing piston 225 to operate within piston bore 226 with minimal or zero head space.

Referring still to FIG. 12, piston 222 may be seen to have an outer circular chamfered face 232 which abuts the outer right-hand surface of lower leaf spring section 218. Thus, when pressurized air is supplied to actuator 224, piston 225 is pushed outwards from bore 226, forcing lower leaf spring section 218 into contact with outer right-hand wall surface 220 of vertical support plate 64A. This action locks or brakes rear tool support yoke 66A from pivoting in a vertical plane with respect to vertical support plate 64A, thereby locking or braking up/down z-axis motion of the tip 34A of ultrasonic transducer tool 74.

Figure 17C:
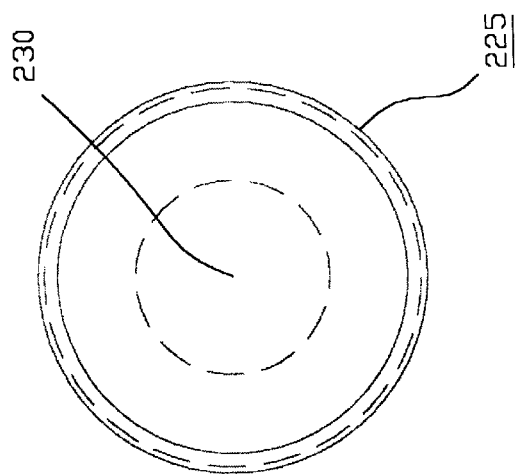
FIG. 17C is a rear or outer elevation view of the piston of FIG. 17A.
Figure 17B:
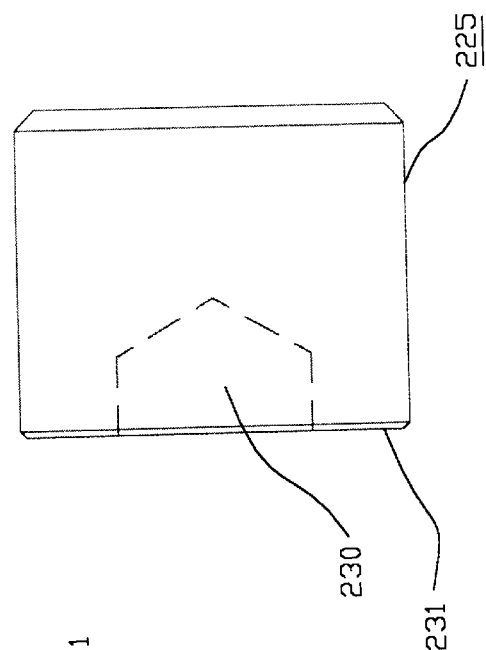
FIG. 17B is a side elevation view of the piston of FIG. 17A.
Figure 17A:
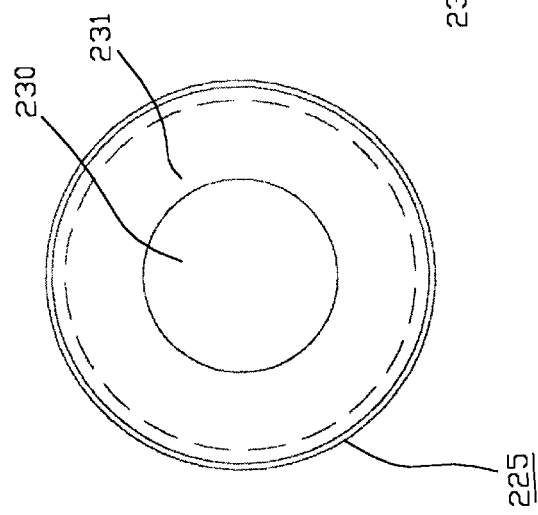
FIG. 17A is a front or inner elevation view of a brake piston comprising a part of the structure of FIG. 12.
Figure 18A:
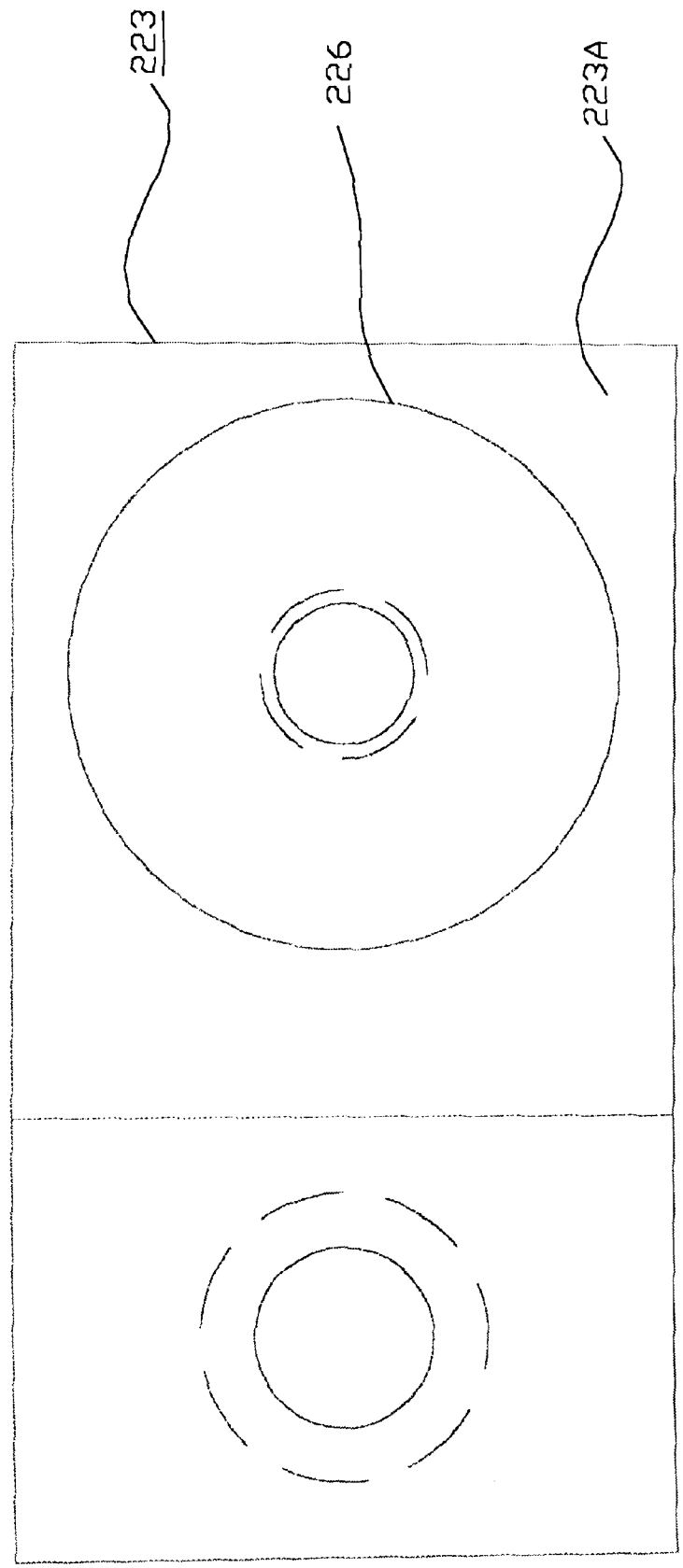
FIG. 18A is a front elevation view of a brake piston housing comprising part of the structure of FIG. 12.
Figure 18C:
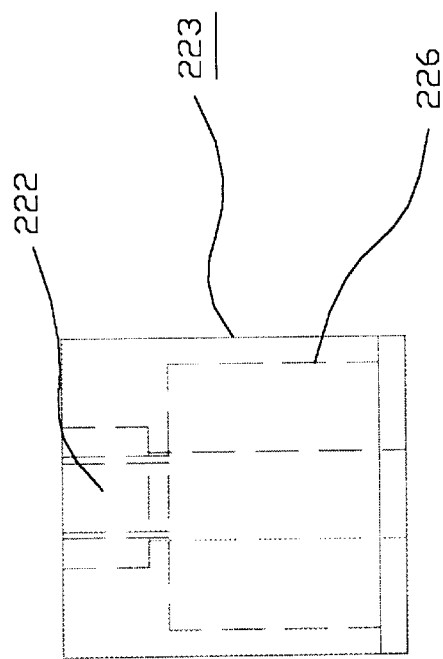
FIG. 18B is a side elevation view of the housing of FIG. 18A.
Figure 18B:
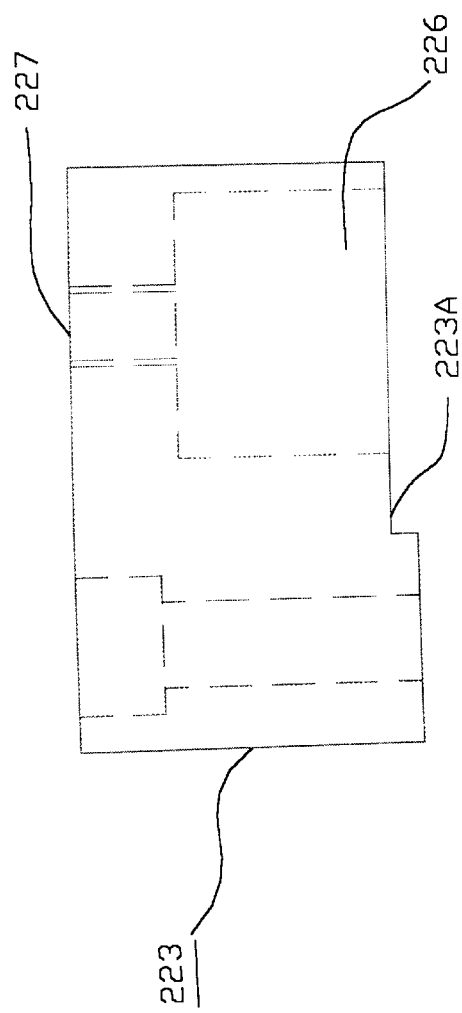
Figure 19:
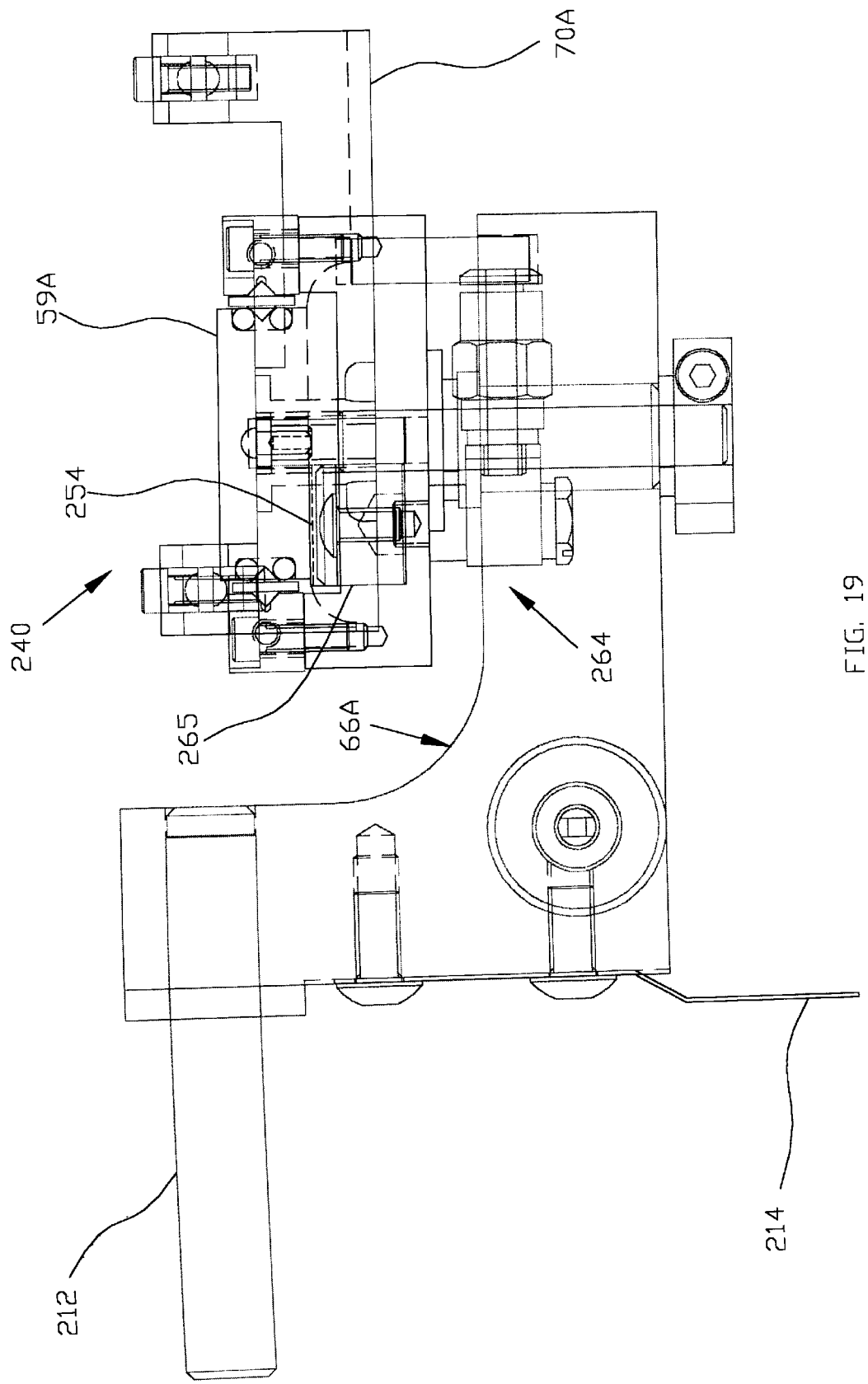
FIG. 19 is a fragmentary front elevation view of a modification of the apparatus shown in FIGS. 1–11.
Figure 20:
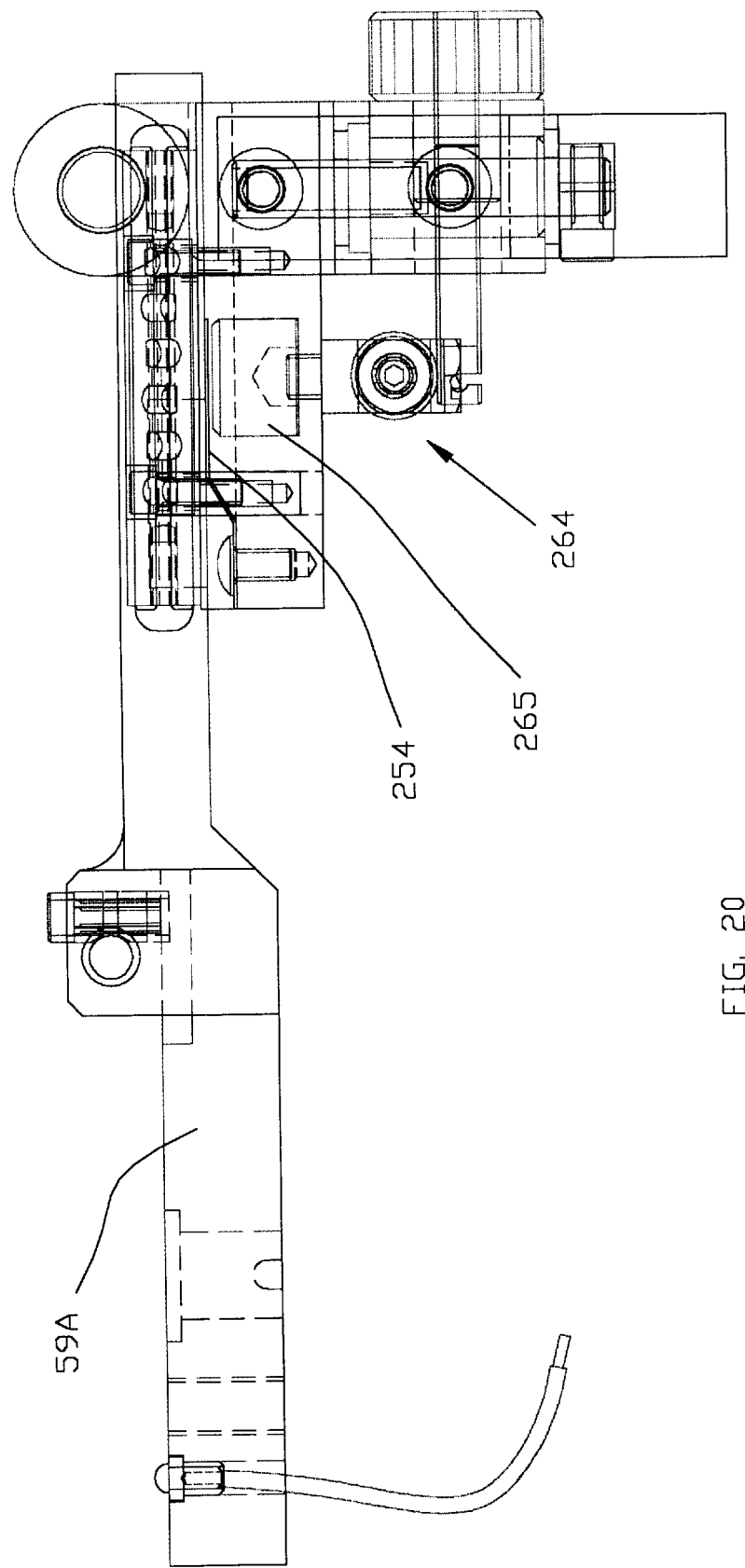
FIG. 20 is a rear side elevation view of the structure of FIG. 19.
Figure 21:
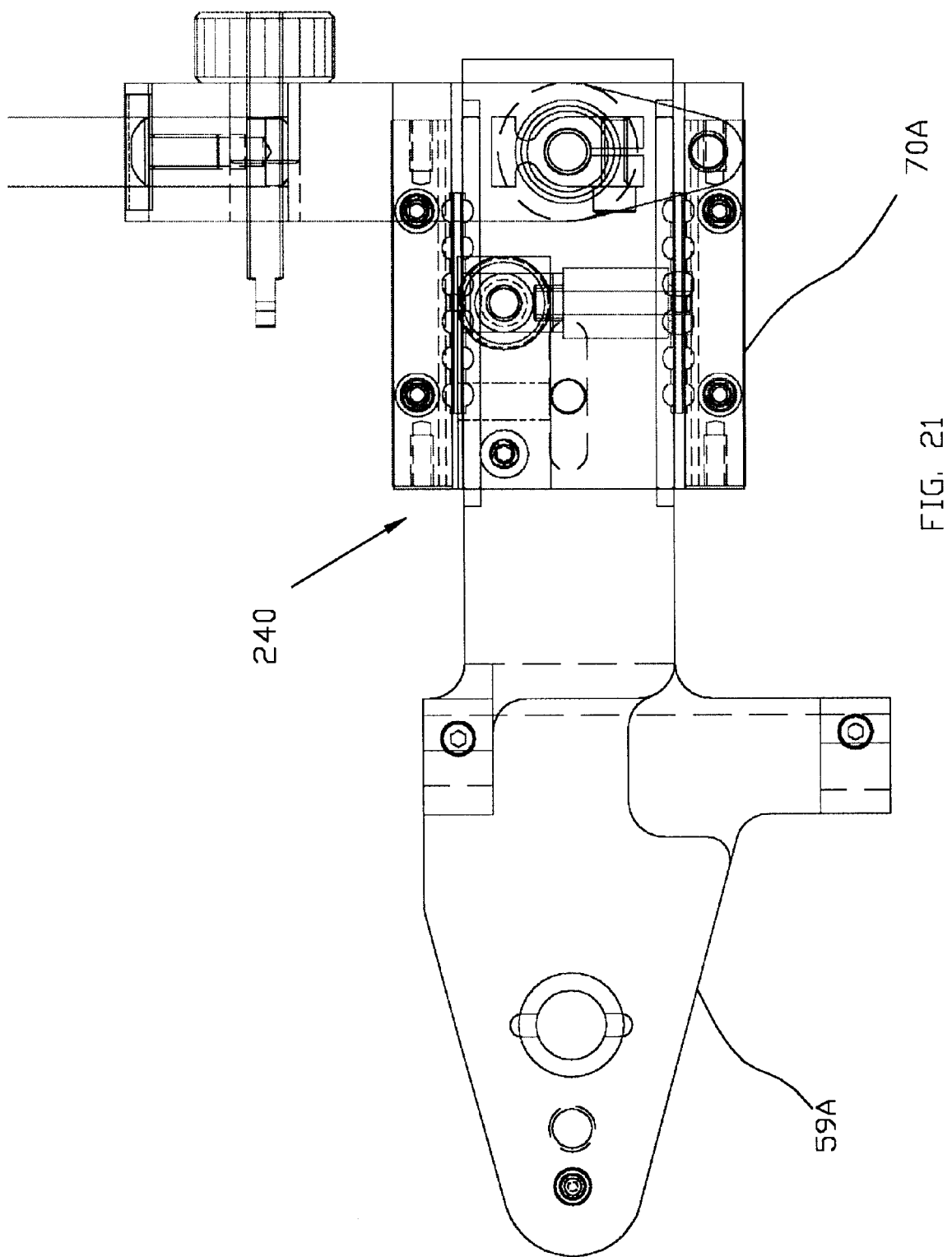
FIG. 21 is an upper plan view of the structure of FIG. 19.

The novel construction of pneumatic brake actuator 224 allows effective operation of the actuator with the requirement for an exhaust value. Thus, as shown in FIGS. 17 and 18, actuator housing 223, which is preferably made from a metal such as an aluminum alloy, has a bore 226 which is about 0.0005 inch larger in diameter than piston 225. As shown in FIGS. 18A and 18B, bore 226 penetrates outer wall surface 223 of actuator housing 223. Thus, when piston 225 is actuated by pressurized air applied to actuator 224, air exits bore 226 at a rate controlled by the small annular ring-shaped space between the piston and bore. Therefore, when a pulse of pressurized air applied to inlet 227 of actuator 224 is terminated, pressurized air leaks from the actuator, allowing leaf spring 214 to force piston 225 to its inner rest or quiescent position within actuator bore 226, without requiring an exhaust valve.

In the novel "leaky" pneumatic brake actuator 224 described above, piston 225 has about 0.0005 inch radial free play within bore 226. Although this displacement is quite small, it could allow unacceptably large relative movement between yoke 66A and vertical support 64A, when it is required to maintain ultrasonic transducer tool tip 34A precisely positioned relative to a workpiece. Therefore, instead of braking yoke 66A relative to vertical support plate 64A by direct contact of outer piston face 232 with wall surface 220 of the vertical support plate, leaf spring 214 is positioned between the outer piston face and wall surface of the vertical support plate. Since leaf spring 214 is flexible in a direction normal to its surface, but completely rigid in directions parallel to its surface, no tangential relative motion can recur between yoke 66A and vertical support plate 64A, in spite of radial motion of piston 225 within its bore 226.

Referring now to FIGS. 19–25, a locking brake according to the present invention is shown which is effective in locking tool tip 34A against in/out, or y-axis motions. As shown in FIGS. 19–25, y-axis locking brake 240 according to the present invention includes a tool support plate 59A and a tool support guide plate 70A which are modifications of corresponding elements 59 and 70 shown in FIGS. 1–11 and described above.

Figure 22:
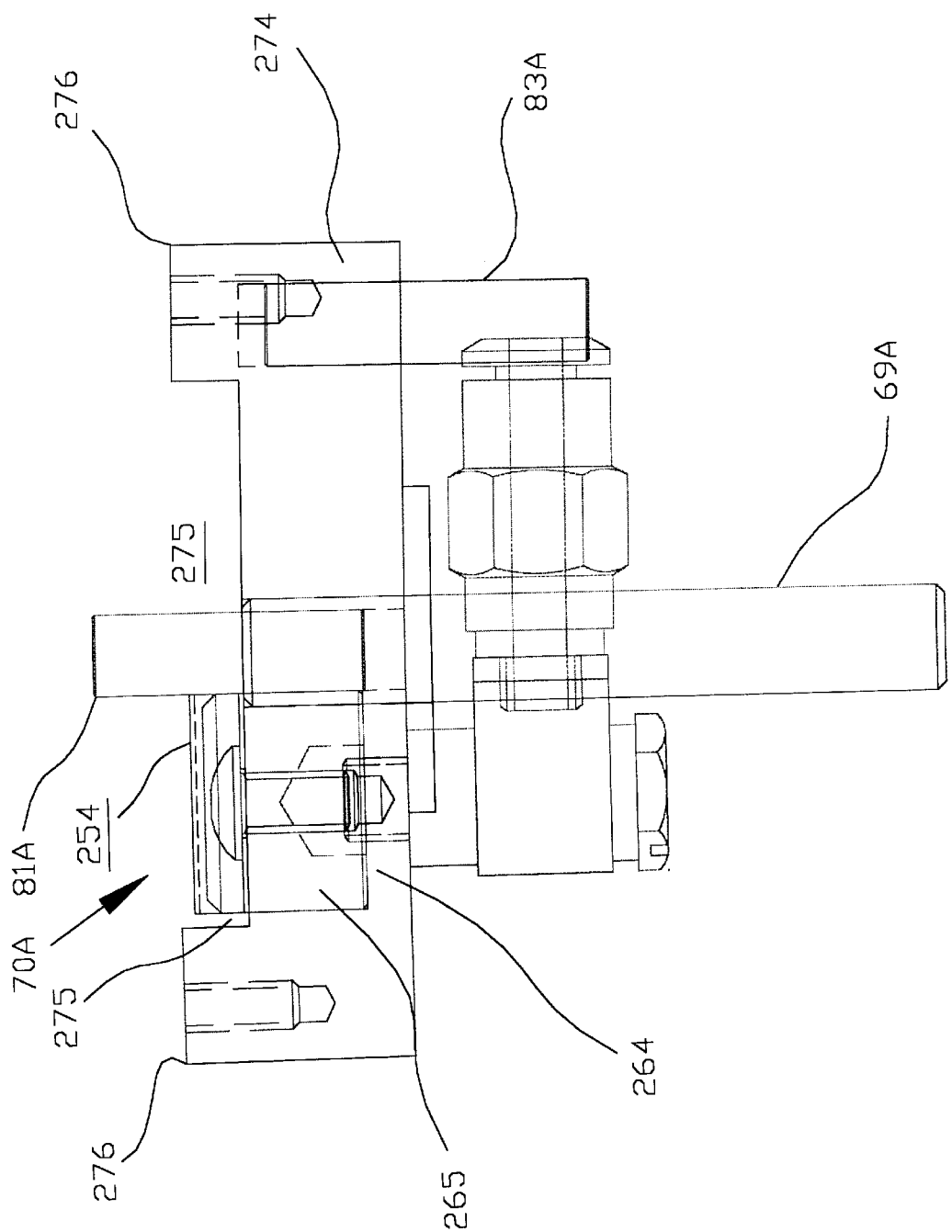
FIG. 22 is a fragmentary front elevation view of the structure of FIG. 19, showing a tool guide plate assembly comprising a part thereof.
Figure 23:
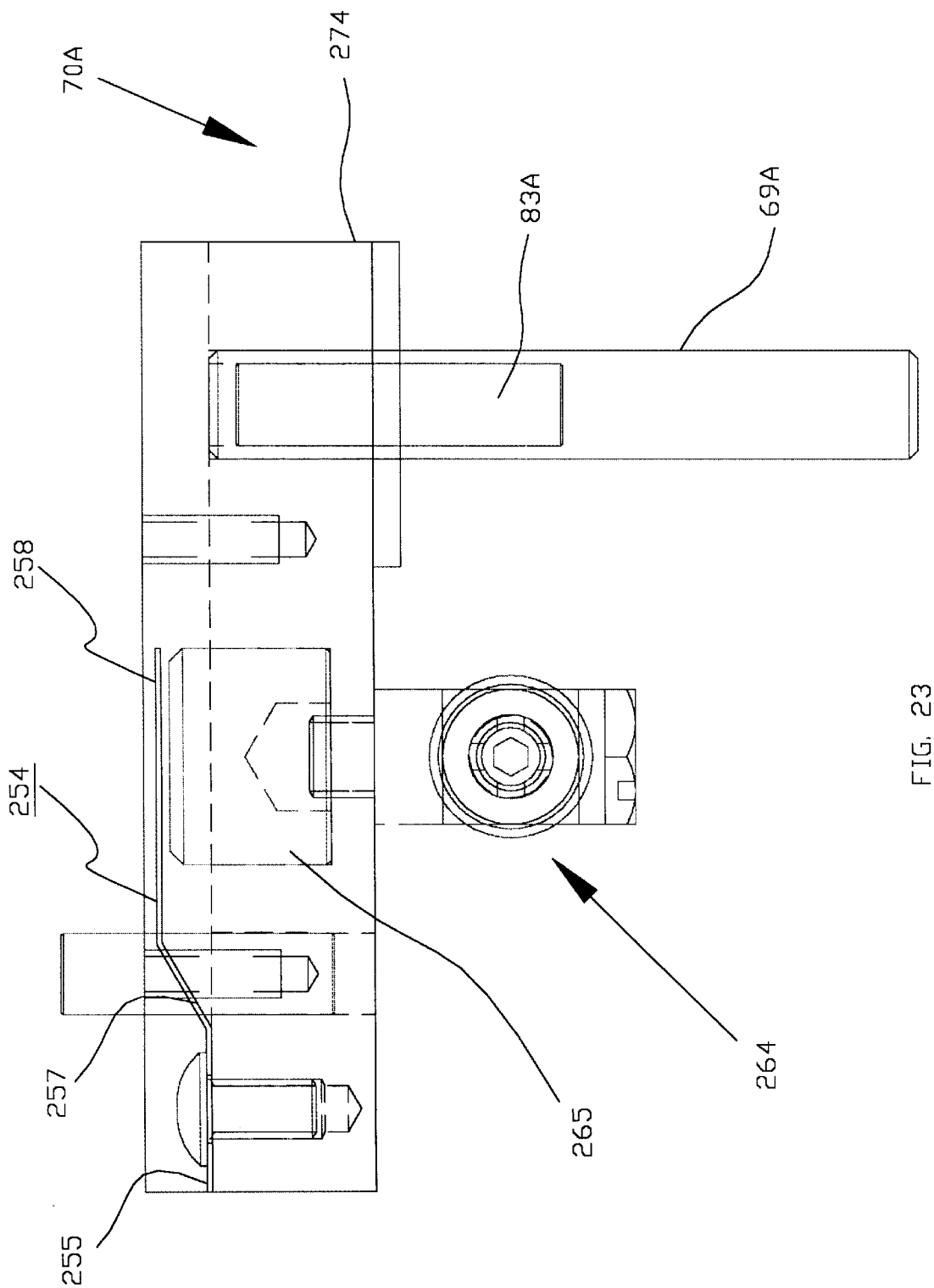
FIG. 23 is a right side elevation view of the article of FIG. 22.
Figure 24:
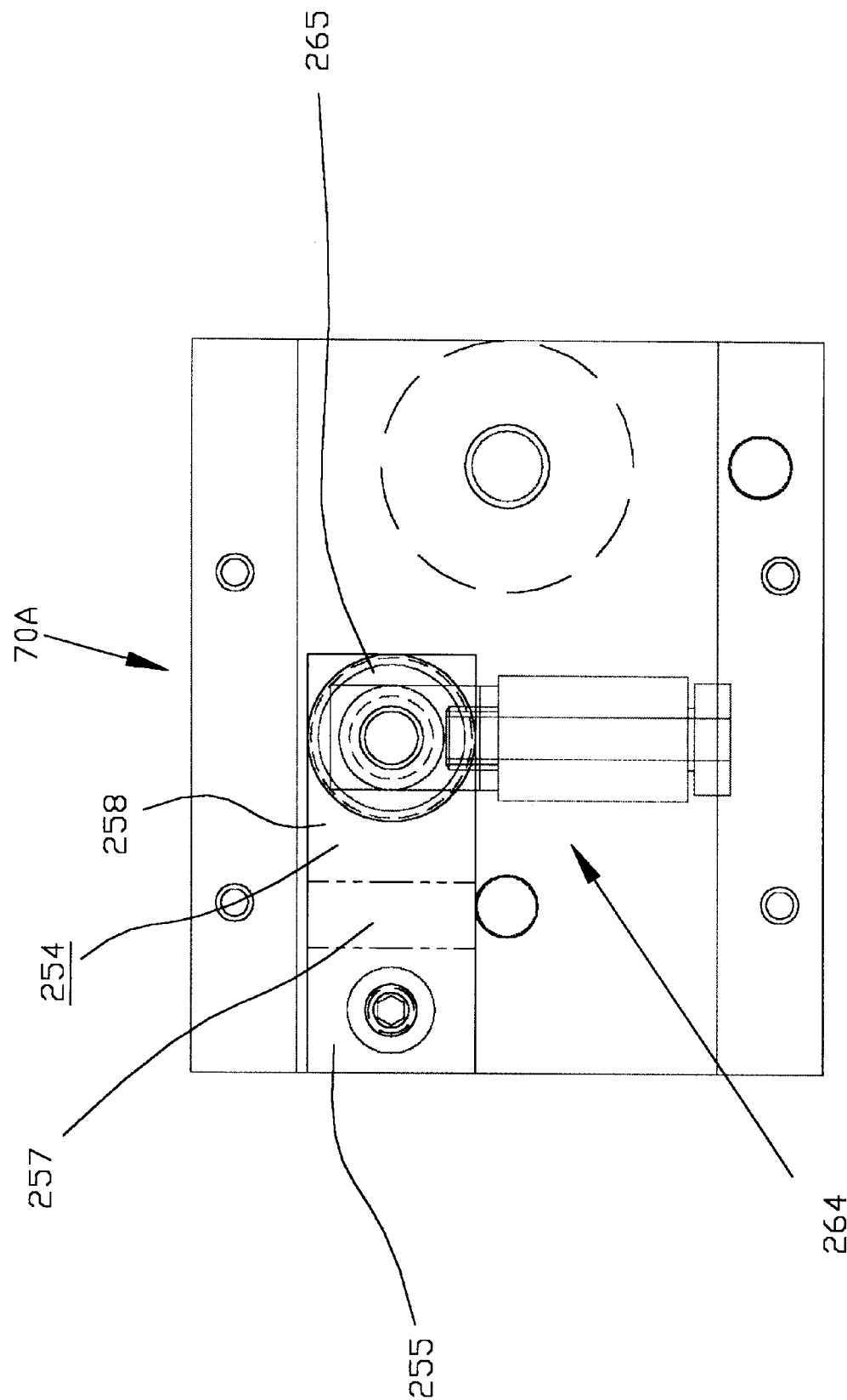
FIG. 24 is a simplified upper plan view of the article of FIG. 22, on a somewhat enlarged scale.

As may be seen best by referring to FIGS. 22–24, modified tool support guide plate 70A differs from tool support guide plate 70 primarily by the addition of a leaf spring 254 and pneumatic locking brake actuator 264 substantially identical in structure and function to leaf spring 214 and actuator 224 of z-axis locking brake 205 depicted in FIGS. 12–18 and described above.

As shown in FIGS. 22 and 23, tool support guide plate 70A has the same general shape as tool support guide plate 70, which is that of a longitudinally elongated, rectangularly-shaped block 274 having in the upper surface thereof a shallow rectangular slot 275 of substantial width, which spans the entire length of the block. Thus formed, block 274 has two laterally opposed, longitudinally disposed rectangular cross section rails 276 which span the length of tool support guide plate 70A. As shown in FIGS. 22 and 23, tool support guide plate 70A includes a downwardly protruding y-axis pivot pin 69A, located on the longitudinal center line of block 274, and near the rear edge wall thereof. Tool support guide plate 70A also includes a downwardly protruding x-axis limit pin 83A, offset from and laterally aligned with pivot pin 69A.

Figure 25:
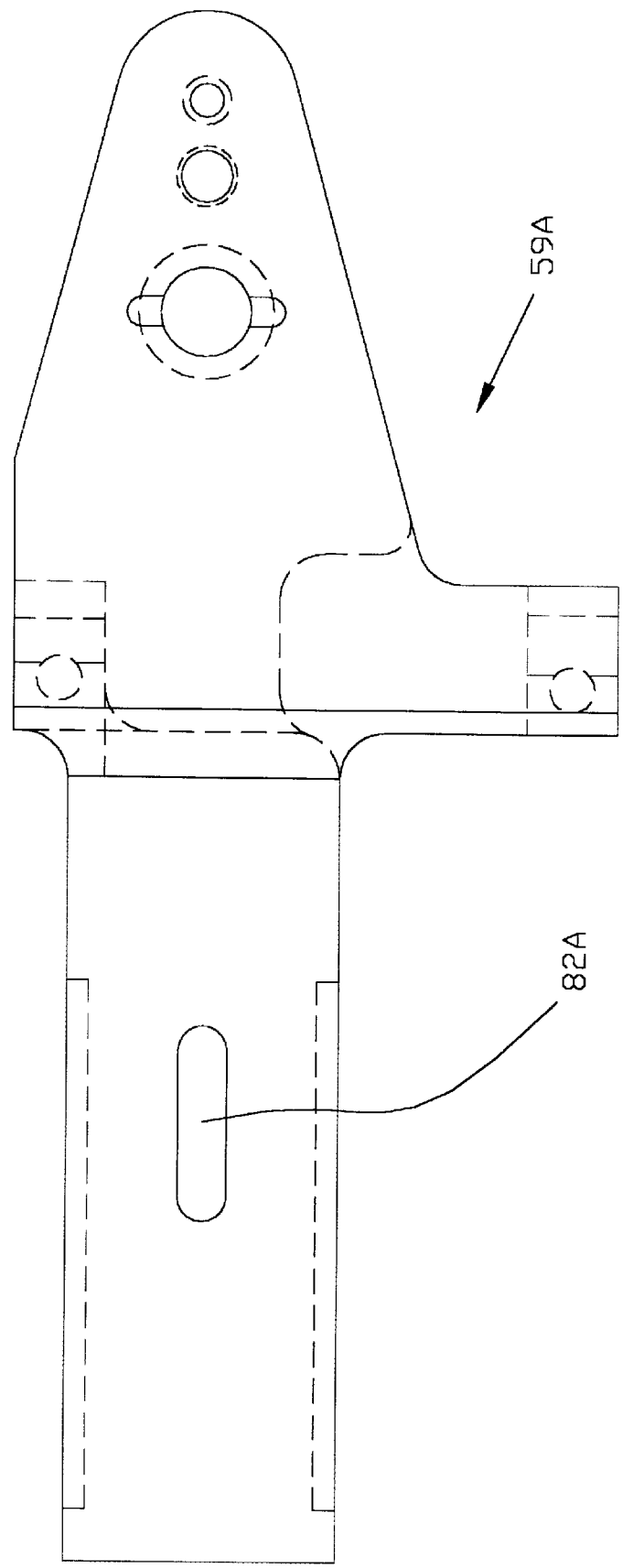
FIG. 25 is a lower plan view of a tool support plate comprising a part of the structure of FIG. 19.

As may be seen best by referring to FIGS. 22 and 25, tool support guide plate 70A also includes a centrally located, upwardly protruding cylindrical pin 81 which is slidably received in a longitudinally disposed rectangular aperture 82A in tool support plate 59A, to limit y-axis motion of the tool support plate. Having described those structural features of modified tool support guide plate 70A which are common with those of basic tool support guide plate 70, the structure and function of the components of y-axis locking brake 240 which are added to tool support guide plate 70A will now be described.

Referring now to FIGS. 22 and 23, modified tool support guide plate 70A may be seen to include a longitudinally elongated, rectangularly-shaped leaf spring substantially identical in structure and function to z-axis locking brake leaf spring 214 described above. Thus, leaf spring 254, which is longitudinally disposed in slot 275 of guide plate 70A, has a front, relatively long rectangular section 255, which is fastened to the upper wall surface 256 of slot 275. Leaf spring 254 has an oblique upwardly and rearwardly angled oblique section 257, and a flat rear section 258 parallel to front section 255.

Referring still to FIGS. 22 and 23, tool support guide plate 70 may be seen to include a pneumatic actuator 264 having a piston 265 which protrudes upwards through a bore in the lower wall surface of block 274, into contact with the lower surface of rear leaf spring section 258. Thus, when actuator 264 is supplied with a pulse of pressurized air, rear portion 258 of leaf spring 259 is pressed into frictional contact with the lower surface of tool support plate 59A, which is slidably held within slot 275. This action brakes or locks tool support plate 59A against longitudinal in/out, or y-axis motion.

What is claimed is:

1. A method for ultrasonic wire bonding comprising;
    a. moving the tip of an ultrasonic wire bonding tool to overlie a precisely determinable location on a workpiece,
    b. moving the tip into contact with a bonding site to permit formation of a bond by application of ultrasonic energy to the bonding site,
    c. locking the tool tip against motion in at least one spacial direction during application of ultrasonic energy to the tool,
    d. releasing the tool tip upon completion of the bond formation, and
    e. withdrawing the tip from the bond site.

2. A micropositioner apparatus for precisely positioning the tip of a wire bonding tool relative to a workpiece, said apparatus comprising:
    a. a manipulator input mechanism having an input control element movable in a first coordinate system,
    b. a follower mechanism including a tool holder for holding a wire bonding tool and moving the tip of said wire bonding tool in a second coordinate system,
    c. coupling means joining said manipulator mechanism to said follower mechanism, whereby motions of said input control element in said first coordinate system are operable through said coupling means to effect motions of said tool tip in said second coordinate system, and
    d. at least one locking means for locking said tip of said wire bonding tool against motion in at least one direction in said second coordinate system during formation of a bond by said tip.

3. The apparatus of claim 1 wherein said tool holder is further defined as having a transducer mount assembly for holding said tool, said transducer mount assembly being pivotally mounted with respect to said rear portion of said tool holder by means of a transducer mount assembly pivot means, whereby the tip of said tool may pivot upwards with respect to said tool holder.

4. The apparatus of claim 3 wherein said transducer mount assembly pivot means is further defined as including force adjusting means, whereby the downward force exerted on a workpiece in response to contact by said tool tip may be limited to a predetermined value.

5. The apparatus of claim 4 further including sensor means for sensing when said tool tip has contacted said workpiece with a predetermined force, said sensor means being operably interconnected to a source of bonding energy conducted to said tool tip, whereby said predetermined force initiates bonding action on said workpiece.

6. The apparatus of claim 3 further including rear yaw pivot means for pivotably supporting said rear portion of said tool holder so as to permit lateral motion on said tool tip.

7. The apparatus of claim 6 further including slide bearing means for slidably supporting said tool holder so as to permit longitudinal motion of said tool tip.

8. The apparatus of claim 7 further including rear pitch pivot means for pivotably supporting said rearward portion of said tool holder so as to permit pivotable motion in a vertical plane of the tip of said tool and said rear portion of said tool holder.

9. The apparatus of claim 8 wherein said longitudinal line of action of said tool tip afforded by said slide bearing means, a pivot axis of said rear pitch pivot means, and a pivot axis of said rear yaw pivot means have a common intersection point.

10. The apparatus of claim 2 wherein said motions of said tool tip are resolved into motions along coordinate axes of said second coordinate system that are in a predetermined relationship to motions of said input control element along corresponding coordinate axes of said first coordinate system.

11. The apparatus of claim 10 wherein said motions of said tool tip along coordinate axes of said second coordinate system are in predetermined ratios with respect to corresponding motions of said input control element along corresponding coordinate axes of said first coordinate system.

12. The apparatus of claim 11 wherein said locking means is further defined as acting on said manipulator input mechanism.

13. The apparatus of claim 11 wherein said at least one direction in which said locking means is effective in locking said tool tip against motion is further defined as being a first direction substantially parallel to a longitudinal line of action defined by said tool tip moving normally to said workpiece to effect a bond.

14. The apparatus of claim 13 further including a second locking means for locking said tool tip against motion in a second direction, orthogonal to said first direction.

15. The apparatus of claim 14 further including a third locking means for locking said tool tip against motion in a third direction orthogonal to said first and second directions.

16. The apparatus of claim 11 wherein said locking means is further defined as being a linear actuator which applies a normal force resulting in braking friction between relatively movable elements of said manipulator input mechanism.

17. The apparatus of claim 16 wherein said linear actuator is further defined as a pneumatic cylinder including a piston longitudinally slidable within a bore, said piston having radial free play clearance sufficiently large to permit air to leak at a controlled rate from said bore.

18. The apparatus of claim 17 further including brake free-play limiting means for limiting tangential relative motion between said relatively movable elements of said manipulator input mechanism.

19. The apparatus of claim 18 wherein said brake free-play limiting means is further defined as being a leaf spring located between the outer face of said piston and a surface of first one of said relatively movable elements, said leaf spring being attached to one of said movable elements and being elastically deformable in a direct parallel to longitudinal motion of said piston, but rigid in directions radial thereto.

* * * * *